United States Patent
Fujiki et al.

(10) Patent No.: US 9,252,291 B2
(45) Date of Patent: Feb. 2, 2016

(54) NONVOLATILE SEMICONDUCTOR MEMORY DEVICE

(75) Inventors: Jun Fujiki, Kanagawa-ken (JP); Naoki Yasuda, Kanagawa-ken (JP); Daisuke Matsushita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1006 days.

(21) Appl. No.: 13/070,108

(22) Filed: Mar. 23, 2011

(65) Prior Publication Data

US 2012/0068159 A1    Mar. 22, 2012

(30) Foreign Application Priority Data

Sep. 16, 2010    (JP) .................. 2010-207800

(51) Int. Cl.
| | |
|---|---|
| H01L 29/08 | (2006.01) |
| H01L 29/792 | (2006.01) |
| G11C 16/04 | (2006.01) |
| H01L 27/115 | (2006.01) |

(52) U.S. Cl.
CPC ............. *H01L 29/792* (2013.01); *G11C 16/04* (2013.01); *G11C 16/0466* (2013.01); *G11C 16/0483* (2013.01); *H01L 27/11582* (2013.01); *H01L 29/7926* (2013.01); *H01L 27/1157* (2013.01)

(58) Field of Classification Search
CPC ............. G11C 16/04; G11C 16/0466; G11C 16/0483; H01L 29/7926; H01L 27/11582; H01L 29/792; H01L 27/1157
USPC .............. 257/29, E29.042, E29.309; 977/755
See application file for complete search history.

(56) References Cited

U.S. PATENT DOCUMENTS

2008/0073635 A1    3/2008    Kiyotoshi et al.

FOREIGN PATENT DOCUMENTS

| JP | 3-94474 A | 4/1991 | |
|---|---|---|---|
| JP | 2004-39965 A | 2/2004 | |
| JP | 2008-78404 | 4/2008 | |
| JP | 2012-064753 | * 3/2012 | .......... H01L 21/8247 |
| KR | 10-0949228 | 3/2010 | |

OTHER PUBLICATIONS

Office Action issued Aug. 24, 2012, in Japanese Patent Application No. 2010-207800 with English translation.

* cited by examiner

*Primary Examiner* — Hrayr A Sayadian
(74) *Attorney, Agent, or Firm* — Oblon, McClelland, Maier & Neustadt, L.L.P.

(57) ABSTRACT

According to one embodiment, a nonvolatile semiconductor memory device includes a first memory portion. The first memory portion includes a first base semiconductor layer, a first electrode, a first channel semiconductor layer, a first base tunnel insulating film, a first channel tunnel insulating, a first charge retention layer and a first block insulating film. The first channel semiconductor layer is provided between the first base semiconductor layer and the first electrode, and includes a first channel portion. The first base tunnel insulating film is provided between the first base semiconductor layer and the first channel semiconductor layer. The first channel tunnel insulating film is provided between the first electrode and the first channel portion. The first charge retention layer is provided between the first electrode and the first channel tunnel insulating film. The first block insulating film is provided between the first electrode and the first charge retention layer.

8 Claims, 13 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2010-207800, filed on Sep. 16, 2010; the entire contents of which are incorporated herein by reference.

FIELD

Embodiments described herein relate generally to a nonvolatile semiconductor memory device.

BACKGROUND

A nonvolatile semiconductor memory device uses the charge storage state in a charge storage layer to store information. There is a demand for increasing a program speed in this type of nonvolatile semiconductor memory device.

Since a conventional nonvolatile semiconductor memory device exhibits a low charge trapping efficiency in a charge storage layer, it is an impediment to increase the program speed. When the charge trapping efficiency is low, the time required for programming is increased, and there is a tendency for deterioration in memory cells due to the program operation.

DETAILED DESCRIPTION

Figure 1:
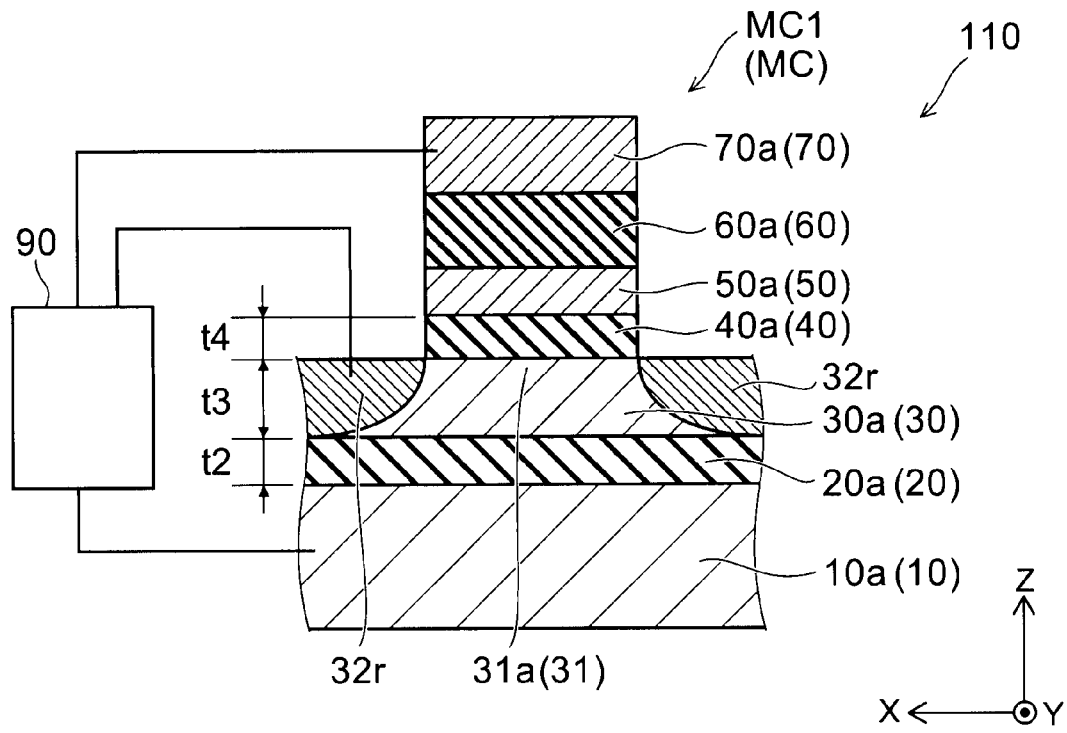
FIG. 1 is a schematic sectional view illustrating the configuration of a nonvolatile semiconductor memory device according to a first embodiment.

In general, according to one embodiment, a nonvolatile semiconductor memory device includes a first memory portion. The first memory portion includes a first base semiconductor layer, a first electrode, a first channel semiconductor layer, a first base tunnel insulating film, a first channel tunnel insulating, a first charge retention layer and a first block insulating film. The first channel semiconductor layer is provided between the first base semiconductor layer and the first electrode, and includes a first channel portion opposed to the first electrode. The first base tunnel insulating film is provided between the first base semiconductor layer and the first channel semiconductor layer. The first channel tunnel insulating film is provided between the first electrode and the first channel portion. The first charge retention layer is provided between the first electrode and the first channel tunnel insulating film to retain a charge. The first block insulating film is provided between the first electrode and the first charge retention layer.

Various embodiments will be described hereinafter with reference to the accompanying drawings.

The diagrams illustrate schematic or conceptual configurations, and the relationship between thickness and width in respective sections, and the proportions of size between respective portions are not necessarily the same as those represented. Furthermore even when representing the same section, different dimensions or proportions may be represented in different drawings.

In the specification of the application and the corresponding figures, the same reference numerals will be used in relation to those features in the figures that have already been described, and detailed description will not be repeated.

First Embodiment

FIG. 1 is a schematic sectional view illustrating the configuration of a nonvolatile semiconductor memory device according to a first embodiment.

As illustrated in FIG. 1, the nonvolatile semiconductor memory device 110 according to the embodiment includes a first memory portion MC1 (memory portion MC).

The first memory portion MC1 includes a first base semiconductor layer 10a (base semiconductor layer 10), a first base tunnel insulating film 20a provided on the first base semiconductor layer 10a (base tunnel insulating layer 20), a first channel semiconductor layer 30a provided on the first base tunnel insulating film 20a (channel semiconductor layer 30), a first channel tunnel insulating film 40a provided on the first channel semiconductor layer 30a (channel tunnel insulating layer 40), a first charge retention layer 50a provided on the first channel tunnel insulating film 40a (charge retention layer 50), a first block insulating film 60a provided on the first charge retention layer 50a (block insulating film 60), and a first electrode 70a (gate electrode 70).

The first channel semiconductor layer 30a includes a first channel portion 31a (channel portion 31). The first channel portion 31a is opposed to the first electrode 70a. In the specific example, two source/drain portions 32r (diffusion region) are provided in the first channel semiconductor layer 30a.

A direction oriented from the first base semiconductor layer 10a towards the first electrode 70a is denoted as the Z-axis direction (first direction). A direction that is perpendicular to the Z-axis direction is denoted as the X-axis direction (second direction), and a direction that is perpendicular to the Z-axis direction and the X-axis direction is denoted as the Y axis direction (third direction).

The two source/drain portions 32r are separated and aligned along the X-axis direction, and the first channel portion 31a is provided between the two source/drain portions 32r.

The base semiconductor layer 10 includes at least one of monocrystalline silicon, polysilicon, amorphous silicon, SiGe, Ge, InP, and GaAs. However, the embodiment is not limited thereto, and an arbitrary semiconductor may be used in the base semiconductor layer 10. The base semiconductor layer 10 may, for example, be provided on the insulating layer provided on a substrate.

The base tunnel insulating film 20, the channel tunnel insulating film 40, and the block insulating film 60 includes, for example, at least one of a silicon oxide film ($SiO_2$), SiN, $TiO_2$, and $Ta_2O_5$. However, the embodiment is not limited thereto, and an arbitrary insulating material may be used for the base tunnel insulating film 20, the channel tunnel insulating film 40, and the block insulating film 60.

The channel semiconductor layer 30 includes at least one of monocrystalline silicon, polysilicon, amorphous silicon, SiGe, Ge, InP, and GaAs. However, the embodiment is not limited thereto, and an arbitrary semiconductor may be used in the channel semiconductor layer 30.

For example, the channel portion 31 is based on a p-type semiconductor, and the source/drain portion 32r is based on an n-type semiconductor. The source/drain portion 32r may be provided as required, or may be included in the channel portion 31 if not needed. When the source/drain portion 32r is provided as p-type, the channel portion 31 (in other words, the channel semiconductor layer 30) is based on, for example, an n-type semiconductor.

The charge retention layer 50 includes, for example, at least one of a silicon oxide film ($SiO_2$), SiN, $TiO_2$, and $Ta_2O_5$. Furthermore, the charge retention layer 50, for example, may include at least one of monocrystalline silicon, polysilicon, amorphous silicon, SiGe, Ge, InP, and GaAs. Furthermore, the charge retention layer 50 may include, for example, at least one of TaN, TiN, AlN, and TiAlN. In addition, a stacked film made of the above materials may be used in the charge retention layer 50. However, the embodiment is not limited thereto, and an arbitrary material may be used in the charge retention layer 50.

The charge retention layer 50 may be formed of, for example, a charge storage layer. The charge storage layer, for example, includes a trap site (for example, a discrete trap), and has the function of trapping injected electrons. For example, the discrete traps are distributed spatially. The discrete traps are distributed, for example, in the charge storage layer. The discrete traps are distributed in proximity to the interface between the change storage layer and other layers (for example, the channel tunnel insulating film 40 and the block insulating film 60, and the like). The charge retention layer 50 may be formed of a layer not including a discrete trap, and polysilicon, for example, may be used in the charge retention layer 50.

An arbitrary conductive material such as polysilicon or various metals may be used, for example, in the gate electrode 70.

The electrical characteristics of the memory portion MC in the nonvolatile semiconductor memory device 110 vary in response to a variation in the state of a charge stored in the charge retention layer 50. This variation in the electrical characteristics is used to store information. The electrical characteristics of the memory portion MC include the threshold voltage of the transistor including the channel semiconductor layer 30 and the gate electrode 70.

A state where a low amount of electrons are stored in the charge retention layer 50 is, for example, denoted as an erase state. A state in which the electron amount stored in the charge retention layer 50 is higher than the erase state is denoted as a program state.

In other words, an operation of executing at least one of electron injection into the charge retention layer 50 or hole extraction from the charge retention layer 50 is denoted as a program operation. For example, the operation of executing at least one of hole injection into the charge retention layer 50 or electron extraction from the charge retention layer 50 is denoted as an erase operation. To simplify the following description, a program operation is described as electron injection into the charge retention layer 50, and an erase operation is described as hole injection into the charge retention layer 50.

The nonvolatile semiconductor memory device 110 may further include a control unit 90. The control unit 90 is connected to a first base semiconductor layer 10a (base semiconductor layer 10) and a first channel semiconductor layer 30a (channel semiconductor layer 30). The control unit 90 may further be connected to the first electrode 70a (gate electrode 70).

The program operation and the erase operation of the nonvolatile semiconductor memory device 110 are executed by the control unit 90. The control unit 90 may be formed using the semiconductor used, for example, in the base semiconductor layer 10. However, the embodiment is not limited thereto, and the control unit 90 may be configured in an arbitrary manner.

The base tunnel insulating film 20 has a thickness t2 (in this example, the length along the Z axis direction). The thickness t2 is set to a suitable value as described below.

The channel tunnel insulating film 40 has a thickness t4 (in this example, the length along the Z axis direction). The thickness t4 is set to a suitable value as described below.

The channel semiconductor layer 30 has a thickness t3 (in this example, the length along the Z axis direction). The thickness t3 is set to a suitable value as described below.

Two tunnel insulating films, in other words, the base tunnel insulating film 20 and a channel tunnel insulating film 40 is provided in the memory portion MC of the nonvolatile semiconductor memory device 110 according to the embodiment. The program operation in the nonvolatile semiconductor memory device 110 that has the above specific configuration will now be described.

Figure 2:
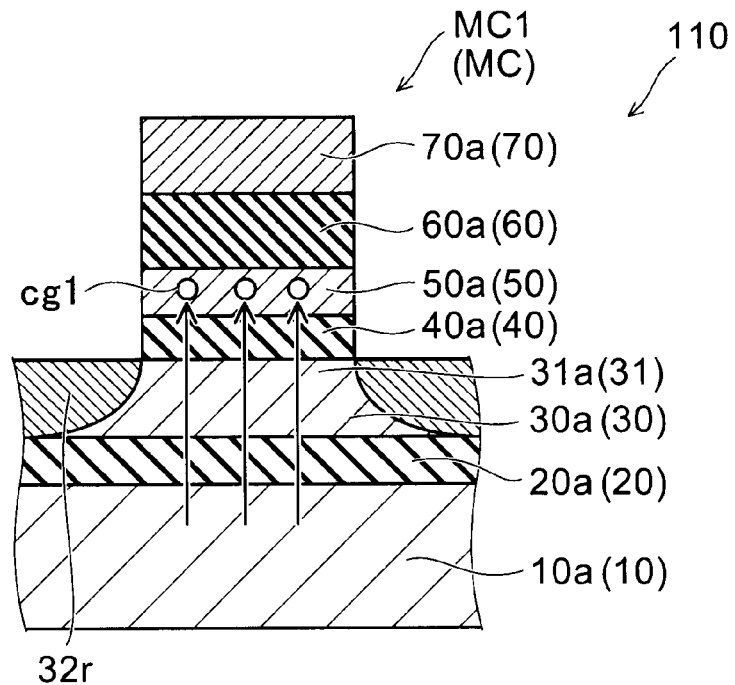
FIG. 2 is a schematic view illustrating an operation of the nonvolatile semiconductor memory device according to the first embodiment.

FIG. 2 is a schematic view illustrating an example of the operation of the nonvolatile semiconductor memory device according to the first embodiment.

As illustrated in FIG. 2, in the program operation in the nonvolatile semiconductor memory device 110, electrons cg1 are injected from the base semiconductor layer 10 through the base tunnel insulating layer 20 and the channel tunnel insulating film 40 into the electron retention layer 50.

For example, the electrons cg1 injected from the base semiconductor layer 10 through the base tunnel insulating film 20 towards the channel semiconductor layer 30 as a result of application of a positive voltage to the channel semiconductor layer 30 using the voltage for the base semiconductor layer 10 as a reference. Consequently, the electrons cg1 reach the electron retention layer 50. In this manner, the program operation is performed.

In other words, ballistic injection of the electrons cg1 is used in the embodiment.

The electrons cg1 are injected from a portion with low potential to a portion with high potential. On the other hand, the hole is injected from a portion with high potential to a portion with low potential.

Figure 3:
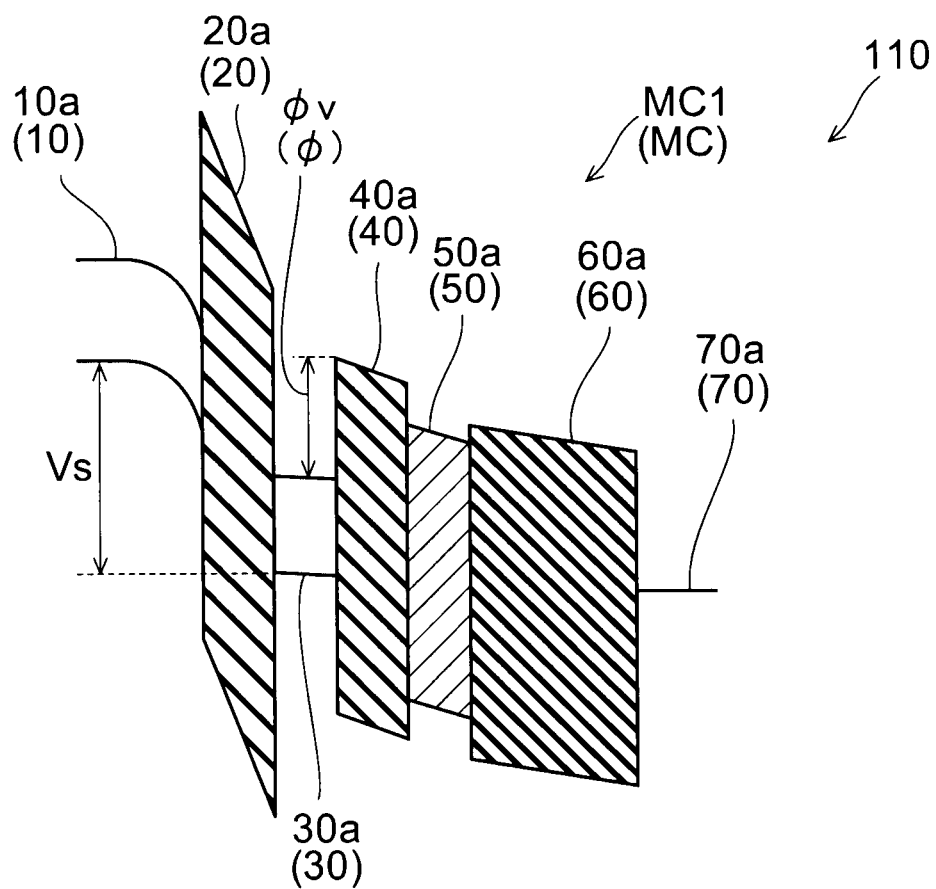
FIG. 3 is a schematic view illustrating the operation of the nonvolatile semiconductor memory device according to the first embodiment.

FIG. 3 is a schematic view illustrating the operation of the nonvolatile semiconductor memory device according to the first embodiment. In other words, FIG. 3 illustrates the band gap energy of the memory portion MC in the program operation.

As illustrated in FIG. 3, the height of the energy barrier of the electrons cg1 of the first channel tunnel insulating film 40a relative to the first channel semiconductor layer 30a (channel semiconductor layer 30) is denoted as the barrier height $\phi$ (electron volt). The potential difference corresponding to the barrier height $\phi$ is denoted as the barrier potential difference $\phi v$ (volts).

The potential of the channel semiconductor layer 30 when the potential of the base semiconductor layer 10 is used as a reference is denoted as the semiconductor interlayer potential difference Vs. When the semiconductor interlayer potential difference Vs is greater than the barrier height $\phi$, at least a part of the electrons cg1 injected from the base semiconductor layer 10 towards the gate electrode 70 exceed the barrier height $\phi$ of the channel tunnel insulating film 40. The electrons cg1 pass through the channel tunnel insulating film 40, and are injected into the charge retention layer 50.

This operation is executed by the control unit 90.

The first memory portion MC1 of the nonvolatile semiconductor memory device 110 according to the embodiment includes a first base semiconductor layer 10a, a first electrode 70a, a first channel semiconductor layer 30a provided between the first base semiconductor layer 10a and the first electrode 70a, and including a first channel portion 31a opposed to the first electrode 70a, a first base tunnel insulating film 20a that is provided between the first base semiconductor layer 10a and the first channel semiconductor layer 30a, a first channel tunnel insulating film 40a provided between the first electrode 70a and the first channel portion 31a, a first charge retention layer 50a provided between the first electrode 70a and the first channel tunnel insulating film 40a, and retaining a charge, and a first block insulating film 60a provided between the first electrode 70a and the first charge retention layer 50a.

The control unit 90 executes the following operation in a program operation that injects electrons cg1 into the first charge retention layer 50a. In the following description, the potential of the first base semiconductor layer 10a is used as a reference when appropriate.

The control unit 90 sets the potential of the first channel semiconductor layer 30a in a program operation to a first potential V1 that is higher than the barrier potential difference $\phi v$ that corresponds to the barrier height $\phi$, when using the potential of the first base semiconductor layer 10a as a reference.

For example, when the first channel tunnel insulating film 40a is configured by a silicon oxide film, the barrier height $\phi$ takes a value of 3.2 electron volts (eV). Consequently, the barrier potential difference $\phi v$ that corresponds to the barrier height $\phi$ takes a value of 3.2 volts (V). Therefore, in this configuration, the first potential V1 that is the potential of the first channel semiconductor layer 30a when using the potential of the first base semiconductor layer 10a as a reference is set to be higher than 3.2 V. In this manner, electrons cg1 can be injected into the charge retention layer 50 from the base semiconductor layer 10a through the base tunnel insulating layer 20 and the channel tunnel insulating film 40.

The control unit 90 can set the potential of the first electrode 70a when executing a program operation to a second potential V2 that is higher than the first potential V1 when using a reference potential (the potential of the first base semiconductor layer 10a). In this manner, the electrons cg1 that pass through the base tunnel insulating film 20 from the base semiconductor layer 10 to reach the channel tunnel insulating layer 40 can be efficiently injected into the charge retention layer 50.

When the semiconductor interlayer potential difference Vs is applied between the base semiconductor layer 10 and the channel semiconductor layer 30, electrons cg1 are injected from the base semiconductor layer 10 into the channel semiconductor layer 30 through the base tunnel insulating film 20. The electrons cg1 that pass through the insulating layer without energy loss obtain an energy that corresponds to the potential difference that is applied to the insulating film (in this example, the semiconductor interlayer potential difference Vs). When the thickness t3 of the channel semiconductor layer 30 is sufficiently thin, a part of the electrons cg1 that reaches the channel semiconductor layer 30 passes over the barrier height $\phi$ of the channel tunnel insulating film 40, and is injected into the charge retention layer 50.

The condition that the electrons cg1 passes through the channel semiconductor layer 30 and the channel tunnel insulating film 40 is expressed as:

$$(Vs - \phi v) > 0 \quad \text{(Equation 1)}$$

In other words, in a program operation, electrons cg1 pass through the channel semiconductor layer 30 and the channel tunnel insulating film 40 and are injected into the charge retention layer 50 since the potential of the first channel semiconductor layer 30a is set to the first potential V1 (potential when using the first base semiconductor layer 10a as a reference) that is higher than the barrier potential difference $\phi v$.

When the potential difference between the base semiconductor layer 10 and the channel semiconductor layer 30 (the semiconductor interlayer potential difference Vs) is designated, the barrier height $\phi$ of the channel tunnel insulating film 40 relative to the channel semiconductor layer 30 (the corresponding barrier potential difference $\phi v$) is set to satisfy $\phi < Vs$ (that is to say, $\phi v < Vs$).

The height t3 of the channel semiconductor layer 30 is set to be less than 30 nanometers (nm). In this manner, a part of the electrons cg1 that reach the channel semiconductor layer 30 is injected into the charge retention layer 50. The height t3 of the channel semiconductor layer 30 is more preferably less than 10 nm. In this manner, a part of the electrons cg1 that reach the channel semiconductor layer 30 can be more efficiently injected into the charge retention layer 50.

The thickness t2 of the base tunnel insulating film 20 is set to not less than 2 nm and 10 nm or less. The thickness t4 of the channel tunnel insulating film 40 is set to not less than 2 nm and 10 nm or less. In this manner, in a program operation, the electrons cg1 can efficiently reach the charge retention layer 50 from the base semiconductor layer 10 through the base tunnel insulating film 20 and the channel tunnel insulating film 40.

In this manner, the speed of program operations in the nonvolatile semiconductor memory device 110 enabling the above operations and having the above configuration can be increased.

In other words, the trapping efficiency of the electrons cg1 in the charge retention layer 50 can be improved by injection of electrons cg1 from the base semiconductor layer 10 into the charge retention layer 50 through the base tunnel insulating film 20 and the channel tunnel insulating film 40.

For example, in the configuration of the nonvolatile semiconductor memory device 110 illustrated in FIG. 1, a high voltage is applied to the gate electrode 70 in the nonvolatile semiconductor memory device in a reference example not provided with a base tunnel insulating film 20. An FN tunnel current is used that flows from the semiconductor layer (for example, the channel semiconductor layer 30) towards the charge retention layer 50, and the electrons cg1 are trapped in the charge retention layer 50 and thereby the programming is executed. In this case, the FN tunnel current is produced by application of a high electric field between the gate electrode 70 and the semiconductor layer (for example, the channel semiconductor layer 30). This electric field, for example, is of the order of approximately 15 megavolts/centimeters (MV/cm). When a high electric field is applied to the tunnel film (for example, the channel tunnel insulating film 40), the electrons cg1 are mainly trapped in a trap site in proximity to the interface of the charge retention layer 50 and the block insulating film 60. In other words, trapping of electrons cg1 is impeded at trap sites in proximity to the interface between the charge retention layer 50 and the tunnel film (for example, the channel tunnel insulating film 40), and the trap site in the central portion along the thickness of the charge retention layer 50. In this manner, a trapping efficiency for electrons cg1 is low in the charge retention layer 50 in the nonvolatile semiconductor memory device according to the reference example.

Lowering the applied electric field effectively improves trapping of electrons cg1 trapped across a broad region along the thickness of the charge retention layer 50, and thereby improves trapping efficiency.

The electric field applied in a program operation can be lowered in the nonvolatile semiconductor memory device 110 according to the embodiment. In other words, the electric field between the base semiconductor layer 10 and the channel semiconductor layer 30 is set, for example, to approximately 10 MV/cm or less. The electric field between the channel semiconductor layer 30 and the gate electrode 70 is set to approximately 10 MV/cm or less. In this manner, in the embodiment, since the applied electric field is low, electrons cg1 can be trapped in trap sites including a trap site in proximity to the interface between the charge retention layer 50 and the block insulating film 60, a trap site in a central portion in the thickness direction of the charge retention layer 50, and a trap site in proximity to the interface between the charge retention layer 50 and the channel tunnel interface film 40. In other words, the nonvolatile semiconductor memory device 110 according to the embodiment exhibits a high trapping efficiency for electrons cg1 in the charge retention layer 50.

In the embodiment, the speed of the program operation can be increased due to the high trapping efficiency of electrons cg1 in the charge retention layer 50.

Thus program operation time can be reduced due to the trapping efficiency for electrons cg1, and therefore deterioration of the memory cells due to programming can be suppressed. Furthermore, since the electric field applied to the channel insulating film 40 can be reduced, deterioration of the channel insulating film 40 can be suppressed. Furthermore, since the electric field applied to the base tunnel insulating film 20 is low, deterioration of the base tunnel insulating film 20 can also be suppressed. In other words, the embodiment increases reliability.

In the embodiment, when electrons cg1 are injected into the charge retention layer 50, the voltage applied to the gate electrode 70 is set to a small value. For example, the applied voltage to the gate electrode 70 may be set so that the electric field applied to the channel tunnel insulating film 40 is less than the 10 MB/cm. For this reason, while maintaining the electric field applied to the channel tunnel insulating film 40 to a low value, high-energy electrons cg1 can be injected into the charge retention layer 50. In this manner, deterioration of the channel tunnel insulating film 40 can be conspicuously reduced.

When executing a program operation in the nonvolatile semiconductor memory device 110, the base semiconductor layer 10 is set, for example, to 0 V. The first potential V1 that is the potential of the channel semiconductor layer 30 is set, for example, to 5 V. In other words, 5 V is applied to the channel semiconductor layer 30. Furthermore, the second potential V2 that is the potential of the gate electrode 70 is set, for example, to 10 V. In other words, 10 V is applied to the gate electrode 70.

In other words, ballistic injection is used to inject electrons cg1 into the charge retention layer 50.

When executing an erase operation in the nonvolatile semiconductor memory device 110, for example, the potential of the base semiconductor layer 10 is set to 10 V, the potential of the channel semiconductor layer 30 is set to 4 V, and the potential of the gate electrode 70 is set to 0 V. In this case, hole injection using ballistic injection is performed into the charge retention layer 50.

When executing an erase operation in the nonvolatile semiconductor memory device 110, for example, the potential of the base semiconductor layer 10 may be set to 20 V, the potential of the channel semiconductor layer 30 may be set to 20 V, and the potential of the gate electrode 70 may be set to 0 V. In this case, erase operations are executed using a FN tunnel current.

When executing a read operation in the nonvolatile semiconductor memory device 110, for example, the potential of the base semiconductor layer 10 may be set to 0 V, the potential of the channel semiconductor layer 30 may be set to 0.05 V (the bit line is connected to the constant voltage source, e.g. 0.05V source, to flow the ON/OFF current), and the potential of the gate electrode 70 may be set to 6 V, and thereby the threshold characteristics of the memory portion MC is detected. Each potential value and each voltage value are merely exemplary, and in the embodiment, such values may be varied.

Multiple memory portions MC may be provided in the nonvolatile semiconductor memory device according to the embodiment. An example of the configuration of the nonvolatile semiconductor memory device 110 when multiple memory portions MC are provided will be described below.

Figure 4:
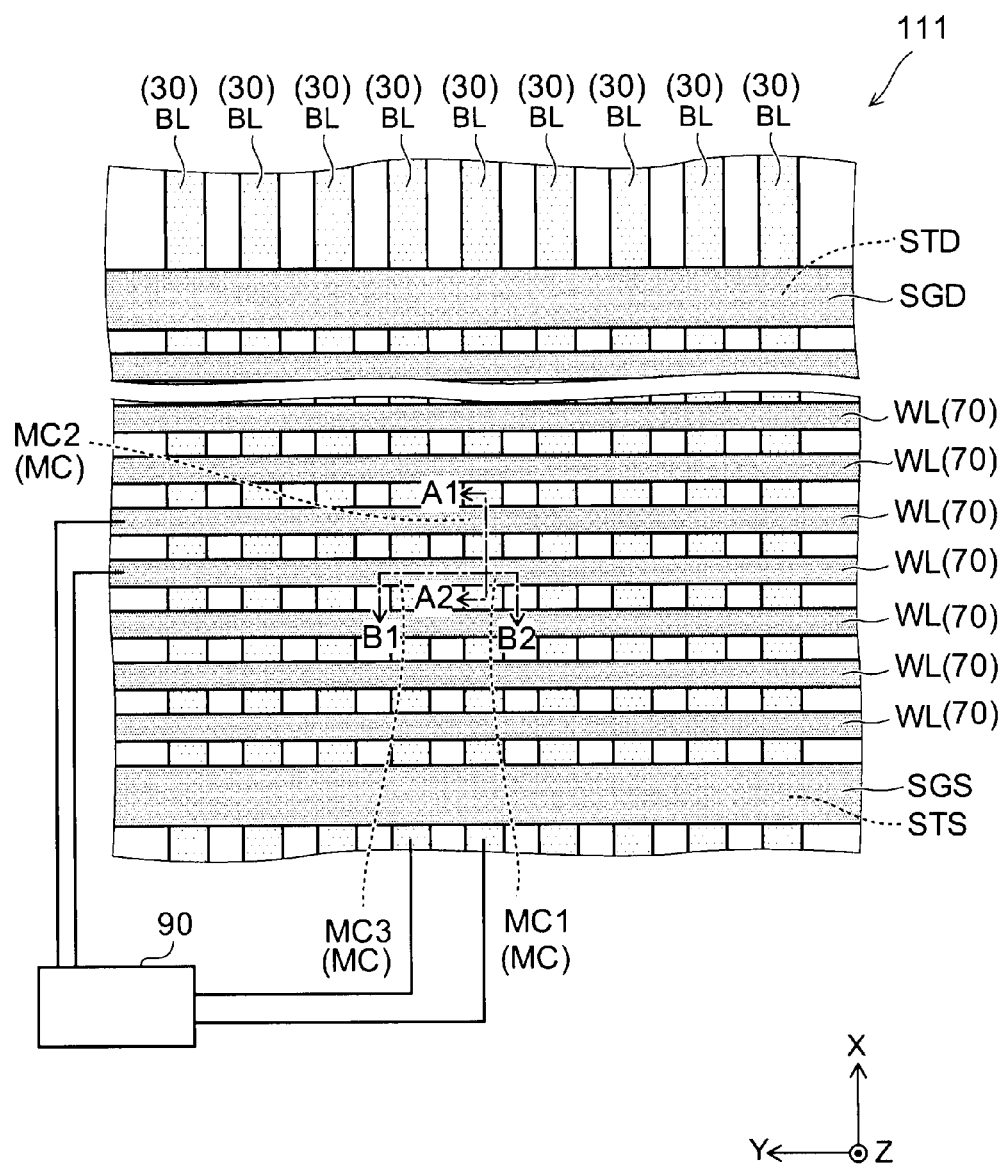
FIG. 4 is a schematic plan view illustrating the configuration of another nonvolatile semiconductor memory device according to the first embodiment.

FIG. 4 is a schematic plan view illustrating the configuration of another nonvolatile semiconductor memory device according to the first embodiment.

Figure 5A:
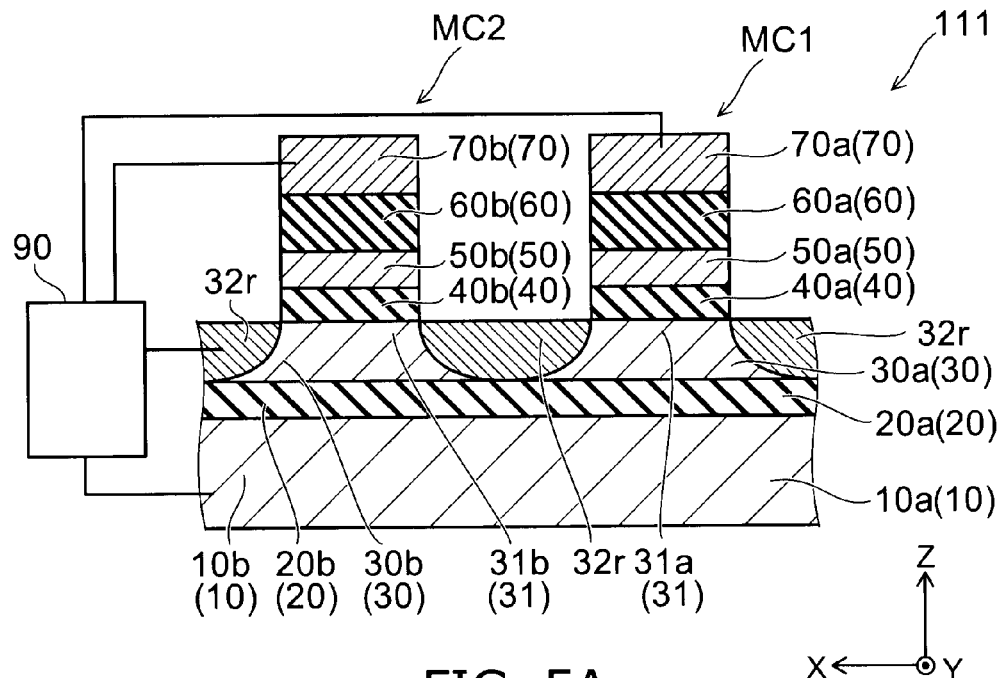
FIG. 5A and FIG. 5B is a schematic sectional view illustrating the configuration of the nonvolatile semiconductor memory device according to the first embodiment.
Figure 5B:
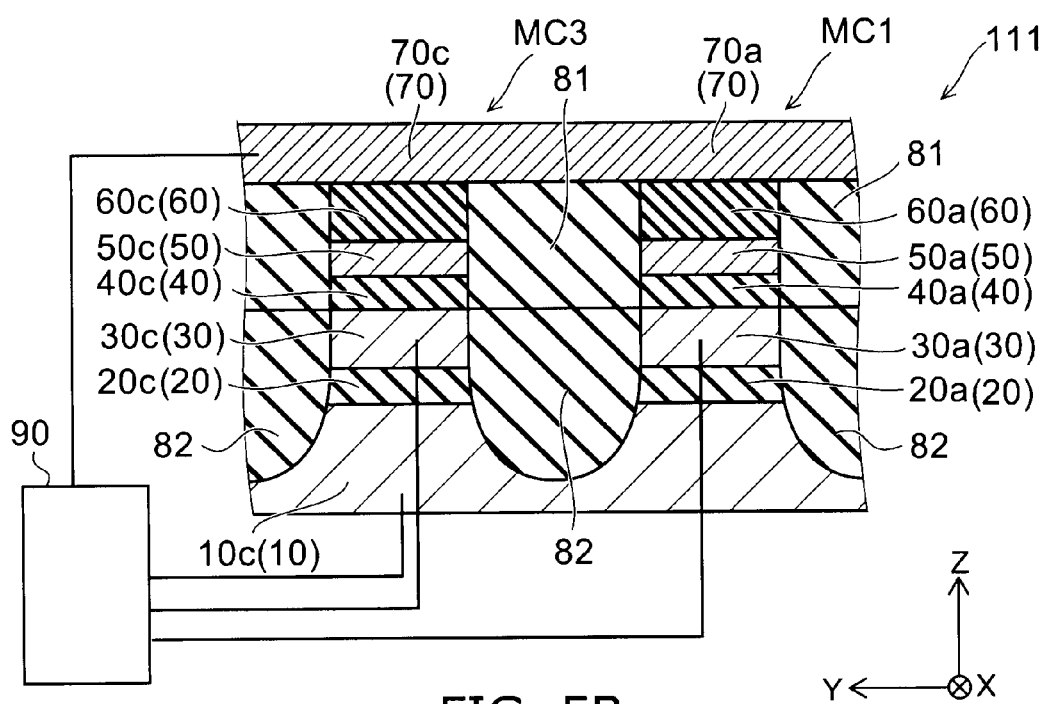

FIG. 5A and FIG. 5B is a schematic sectional view illustrating the configuration of the nonvolatile semiconductor memory device according to the first embodiment.

In other words, FIG. 5A is a sectional view along the line A1-A2 in FIG. 4, and FIG. 5B is a sectional view along the line B1-B2 in FIG. 4.

As illustrated in FIG. 4, multiple memory portions MC are provided in the nonvolatile semiconductor memory device 111 according to the embodiment. One memory portion MC includes the configuration described in relation to FIG. 1. The multiple memory portions MC are aligned in a matrix configuration along the X-axis direction and the Y-axis direction.

For example, the multiple gate electrodes 70 are electrically connected along the Y-axis direction to thereby function as a word line WL. Multiple word lines WL are aligned along the X-axis direction. The multiple channel semiconductor layers 30 are electrically connected along the X-axis direction to thereby function as a bit line BL. Multiple bit lines BL are aligned along the Y-axis direction. Multiple memory portions MC are provided in one bit line BL, and these memory portions MC are NAND connected. In this manner, the memory portions MC are respectively provided in a crossover portion between a word line WL and a bit line BL.

A source selection transistor STS is provided on one end of the array of multiple memory portions MC in a single bit line BL, and a drain selection transistor STD is provided on the other end. The source selection transistor STS is provided in a crossover portion between the channel semiconductor layer 30 (bit line BL) and the source side gate electrode SGS. The drain selection transistor STD is provided in a crossover portion between the channel semiconductor layer 30 (bit line BL) and the drain side gate electrode SGD.

In this manner, the nonvolatile semiconductor memory device 111 is further provided with a second memory portion MC2 and a third memory portion MC3 in addition to the first memory portion MC1 described above.

The second memory portion MC2 is aligned with the first memory portion MC1 along the second direction (X-axis direction) that is perpendicular to the first direction (Z-axis direction) from the first base semiconductor layer 10a towards the first electrode 70a.

The third memory portion MC3 is aligned with the first memory portion MC1 along the third direction (Y-axis direction) that is perpendicular to the first direction and the second direction.

The second memory portion MC2 includes a second base semiconductor layer 10b, a second electrode 70b, a second channel semiconductor layer 30b, a second base tunnel insulating film 20b, a second channel tunnel insulating film 40b, a second charge retention layer 50b, and a second block insulating film 60b.

The second channel semiconductor layer 30b is provided between the second base semiconductor layer 10b and a second electrode 70b, and includes a second channel portion 31b opposed to the second electrode 70b. The second base tunnel insulating film 20b is provided between the second base semiconductor layer 10b and second channel semiconductor layer 30b. The second channel tunnel insulating film 40b is provided between the second electrode 70b and the second channel portion 31b. The second charge retention layer 50b is provided between the second electrode 70b and the second channel tunnel insulating film 40b, and retains a charge. The second block insulating film 60b is provided between the second electrode 70b and the second charge retention layer 50b.

The third memory portion MC3 includes a third base semiconductor layer 10c, a third electrode 70c, a third channel semiconductor layer 30c, a third base tunnel insulating film 20c, a third channel tunnel insulating film 40c, a third charge retention layer 50c, and a third block insulating film 60c.

The third channel semiconductor layer 30c is provided between the third base semiconductor layer 10c and a third electrode 70c, and includes a third channel portion 31c opposed to the third electrode 70c. The third base tunnel insulating film 20c is provided between the third base semi-conductor layer 10c and a third channel semiconductor layer 30c. The third channel tunnel insulating film 40c is provided between the third electrode 70c and the third channel portion 31c. The third charge retention layer 50c is provided between the third electrode 70c and the third channel tunnel insulating film 40c, and retains a charge. The third block insulating film 60c is provided between the third electrode 70c and the third charge retention layer 50c.

The second channel semiconductor layer 30b is electrically connected with the first channel semiconductor layer 30a. The third channel semiconductor layer 30c is separated from the first channel semiconductor layer 30a and the second channel semiconductor layer 30b.

The third electrode 70c is electrically connected with the first electrode 70a.

As illustrated in FIG. 5A, the source/drain portion 32r is provided between the first channel portion 31a and the second channel portion 31b. In this manner, the source/drain portion 32r is provided between the channel portions 31 in the respective multiple memory portions MC.

As illustrated in FIG. 5B, an element separation insulating film 82 is provided between the first memory portion MC1 and the third memory portion MC3. In other words, the element separation insulating film 82 is provided between the first base tunnel insulating film 20a and the third base tunnel insulating film 20c, and between the first channel semiconductor layer 30a and the third channel semiconductor layer 30c. Furthermore, an interlayer insulating film 81 is provided between the first channel tunnel insulating film 40a and the third channel tunnel insulating film 40c, between the first charge retention layer 50a and the third charge retention layer 50c, and between the first block insulating film 60a and the third block insulating film 60c.

Although omitted from FIG. 5A, the interlayer insulating film 81 is provided between the first channel tunnel insulating film 40a and the second channel tunnel insulating film 40b, between the first charge retention layer 50a and the second charge retention layer 50b, and between the first block insulating film 60a and the second block insulating film 60b.

As illustrated in FIG. 5A and FIG. 5B, the control unit 90 is further connected to the second electrode 70b and the third channel semiconductor layer 30c.

In other words, in the nonvolatile semiconductor memory device 111, unit memory cells (memory portion MC) are connected in series along the bit line BL direction. Neighboring memory portions MC share a diffusion layer region (source/drain portion 32r). On the other hand, neighboring memory portions MC in the word line WL direction are electrically separated. Furthermore, memory portions MC aligned in the word line WL direction share a common word line WL.

The operation of the nonvolatile semiconductor memory device 111 that has the above configuration will be described hereafter.

Figure 6:
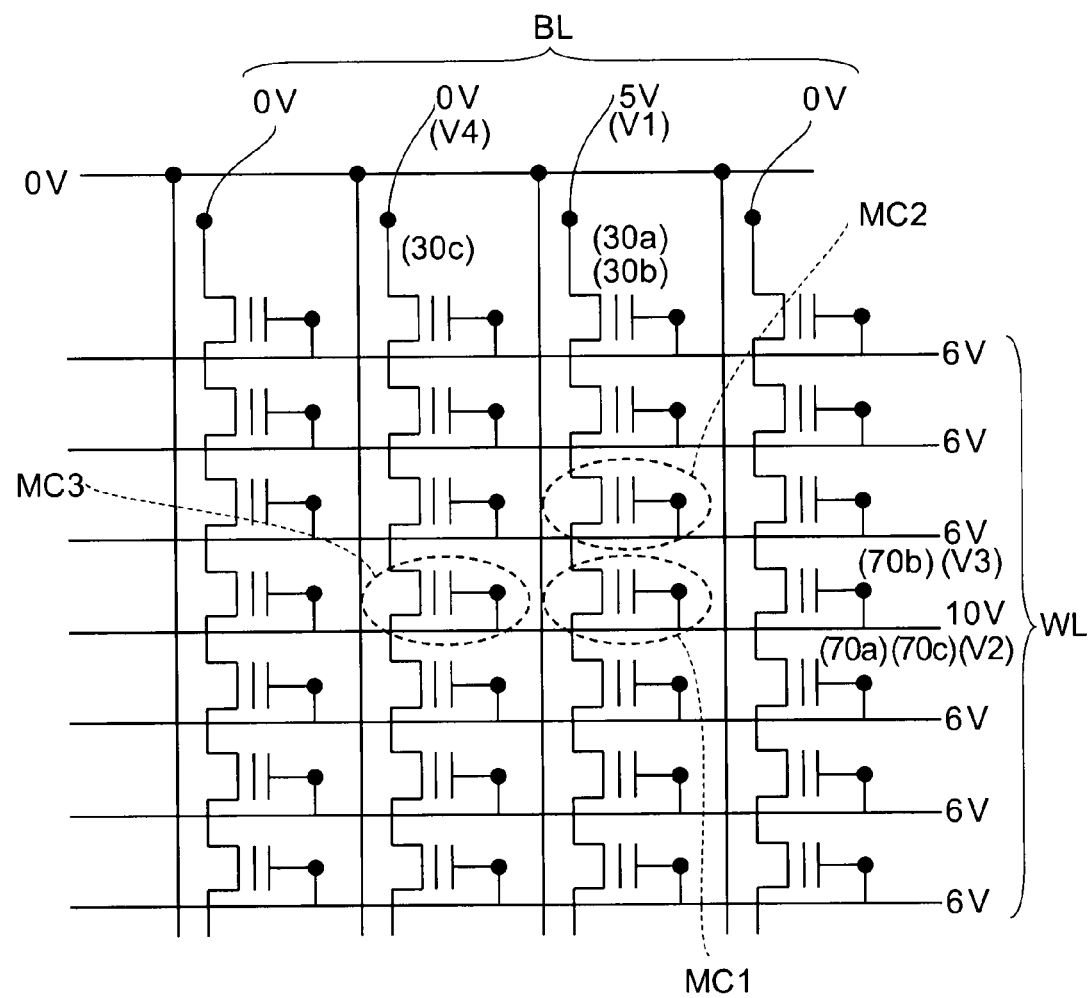
FIG. 6 is a schematic view illustrating a program operation of the nonvolatile semiconductor memory device according to the first embodiment.

FIG. 6 is a schematic view illustrating an example of the program operation of the nonvolatile semiconductor memory device according to the first embodiment.

FIG. 6 illustrates a potential when selectively executing a program operation with respect to the first memory portion MC1. In other words, in the specific example, programming is not executed on the second memory portion MC2 and the third memory portion MC3.

As illustrated in FIG. 6, when a program operation is executed on the first memory portion MC1, the control unit 90 sets the potential of the first channel semiconductor layer 30a to a first potential V1 that is higher than the barrier potential difference $\phi1$ that is barrier potential difference $\phi v$ when using the potential of the first base semiconductor layer 10a as a reference. In this example, the first potential V1 is 5 V. The potential of the first base semiconductor layer 10a is set to 0 V. The control unit 90 sets the potential of the first electrode 70a to a second potential V2 that is higher than the first potential V1 when using the potential of the first base semiconductor layer 10a as a reference. In this example, the second potential V2 is 10 V. In this manner, a program operation can be executed on the first memory portion MC1.

The control unit 90 sets the potential of the second electrode 70b to a third potential V3 that is lower than the second potential V2 when using the potential of the second base semiconductor layer 10b as a reference. In this manner, a program operation on the second memory portion MC2 is suppressed.

The control unit 90 sets the potential of the third channel semiconductor layer 30c to a fourth potential V4 that is lower than the barrier potential difference ϕv corresponding to the electron energy barrier height of the third channel tunnel insulating film 40c in relation to the third channel semiconductor layer 30c when using the potential of the third base semiconductor layer 10c as a reference. In this example, the fourth potential V4 is 0 V. In this manner, a program operation is suppressed in relation to the third memory portion MC3.

A selective program operation is executed in relation to the first memory portion MC1 by application of the above voltages to each memory portion MC.

The potential of the second base semiconductor layer 10b is set to the potential of the first base semiconductor layer 10a (in the example, 10 V). However, the potential of the second base semiconductor layer 10b may differ from the potential of the first base semiconductor layer 10a as a result of a fall in the voltage or the like. For example, the potential of the second channel semiconductor layer 30b is set to the first potential V1. In other words, the first channel semiconductor layer 30a and the second channel semiconductor layer 30b are set to the same potential. However, the potential of the second channel semiconductor layer 30b may differ from the potential of the first channel semiconductor layer 30a as a result of a fall in the voltage or the like. The potential of the third electrode 70c, for example, is set to a potential that is higher than the first potential V1. In the example, the potential of the third electrode 70c is set to the second potential V2 (in the example, 10 V). However, the potential of the third electrode 70c may differ from the second potential V2 as a result of a fall in the voltage or the like.

When executing a program operation on the first memory portion MC1, a voltage 0 V is applied to the base semiconductor layer 10, and a bit line voltage VBL that is a positive voltage (first potential V1, for example, 5V) is applied to the bit line BL belonging to the first memory portion MC1. 0 V is applied to other bit lines BL.

A program voltage VWL that is a positive voltage (second potential V2, for example, 10 V) is applied to the word line WL that shares the first memory portion MC1. The pass voltage VPASS that is a positive voltage (third potential V3, for example, 6 V), is applied to other word lines WL. The pass voltage VPASS is preferably higher than the bit line voltage VBL. The program voltage VWL is preferably higher than the pass voltage VPASS.

When these voltages are applied, all memory cell transistors are in the ON state. The bit line BL to which the first memory portion MC1 belongs is maintained to the bit line voltage VBL (for example, 5 V). A potential difference of the bit line voltage VBL is produced between the bit line BL to which the first memory portion MC1 belongs and the base semiconductor layer 10. Furthermore, since a potential difference of (VWL-VBL) is produced between the bit line BL to which the first memory portion MC1 belongs and the word line WL that shares the first memory portion MC1, electrons are supplied from the base semiconductor layer 10 to the bit line BL to which the memory portion MC1 belongs through the base tunnel insulating film 20. Furthermore, the part of the electrons cg1 that satisfy Equation 1 is injected into the first charge retention layer 50a of the first memory portion MC1. In this manner, the program operation is executed.

Programming is not performed in the second memory portion MC2 that is connected in series with the first memory portion MC1. In other words, although a potential difference in the bit line voltage VBL is produced between bit line BL to which the second memory portion MC2 belongs and the base semiconductor layer 10, since a potential difference of (VPASS-VBL) is applied between the bit line BL to which the second memory portion MC2 belongs and the word line WL that is shared by the second memory portion MC2, a sufficient electric field is not applied to the second channel tunnel insulating film 40b of the second memory portion MC2. As a result, programming is not performed in the second memory portion MC2.

Furthermore a potential difference does not exist between the base semiconductor layer 10 and the bit line BL to which the third memory portion MC3 belongs, in the third memory portion MC3 that shares the word line WL with the first memory portion MC1. Furthermore since the voltage between the bit line BL to which the third memory portion MC3 belongs and the word line WL that is shared by the third memory portion MC3 is a program voltage VWL and a low voltage, the electrons cg1 are not supplied to the third charge retention layer 50c by the FN tunnel current.

In the same manner, in a separate memory portion MC that shares the word line WL with the second memory portion MC2, since the voltage between the bit line BL to which the memory portion MC belongs and the word line WL that is shared by the memory portion MC is a pass voltage VPASS and a low voltage, the electrons cg1 are not supplied to the charge retention layer 50 by the FN tunnel current.

In this manner, programming can be selectively executed in a specified memory portion MC (herein, the first memory portion MC1). Furthermore, in the embodiment, in a program operation, the electric field applied to the memory portion MC is low. Consequently, the speed of programming can be increased. Furthermore reliability can be improved.

Figure 7:
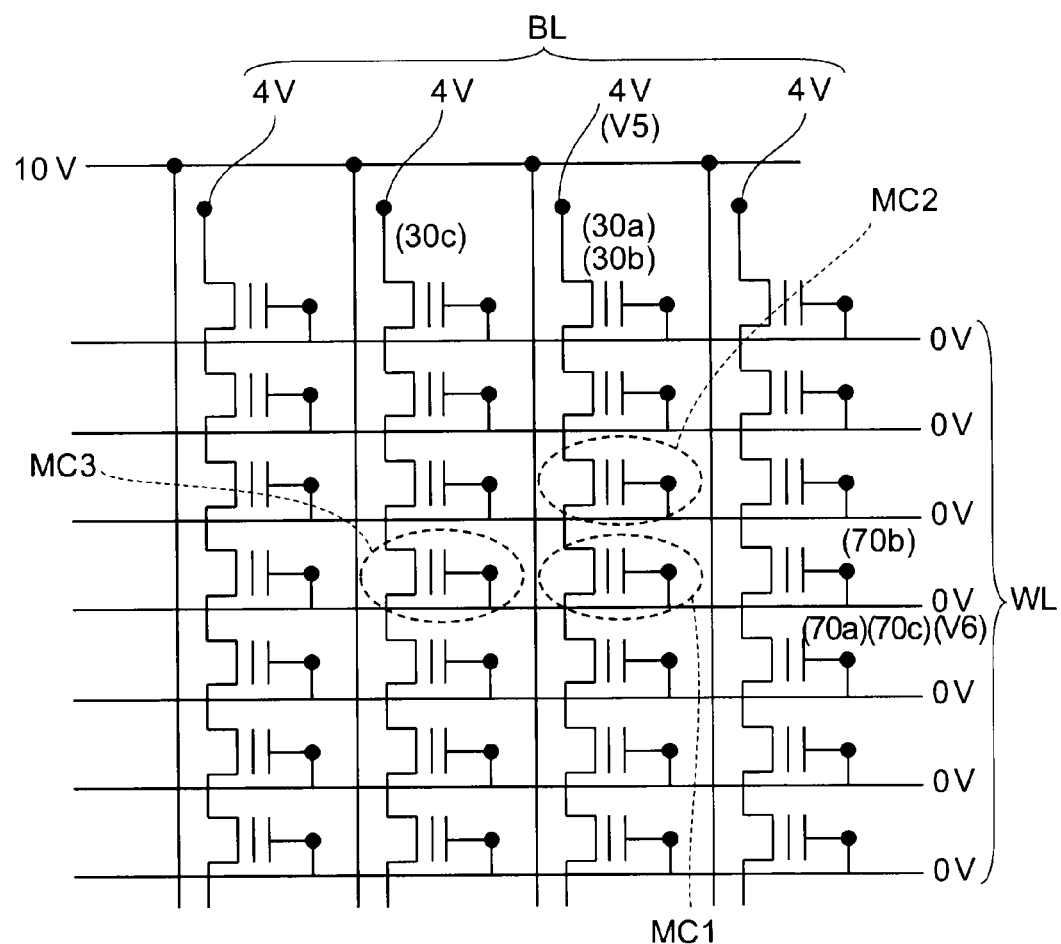
FIG. 7 is a schematic view illustrating an erase operation of the nonvolatile semiconductor memory device according to the first embodiment.

FIG. 7 is a schematic view illustrating an example of the erase operation of the nonvolatile semiconductor memory device according to the first embodiment.

FIG. 7 illustrates the operation when erasing the first memory portion MC1, the second memory portion MC2 and the third memory portion MC3.

The control unit 90 sets the potential of the first channel semiconductor layer 30a in an erase operation to a fifth potential V5 that is lower than the potential of the base semiconductor layer 10a. In this example, the potential of the first base semiconductor layer 10a is set to 10 V, and the potential of the first channel semiconductor layer 30a is set to 4 V. In other words, the fifth potential V5 is set to minus 6 V. The control unit 90 sets the potential of the first electrode 70a to a sixth potential V6 that is lower than the potential of the first channel semiconductor layer 30a. In this example, the potential of the first electrode 70a is set to 0 V. In other words, the sixth potential V6 is minus 10 V.

The control unit 90 sets the potential of the second base semiconductor layer 10b and the third base semiconductor layer 10c to 10 V that is the same as the potential of the first base semiconductor layer 10a. Furthermore, the control unit 90 sets the potential of the second channel semiconductor layer 30b and the third channel semiconductor layer 30c to 4 V that is the same as the potential of the first channel semiconductor layer 30a. Furthermore, the control unit 90 sets the potential of the second electrode 70b and the third electrode 70c to 0 V that is the same as the potential of the first electrode 70a.

In this manner, hole injection into the charge retention layer 50 using ballistic injection is executed in the first memory portion to the third memory portion, MC1 to MC3, and thereby erase operations are executed.

Figure 8:
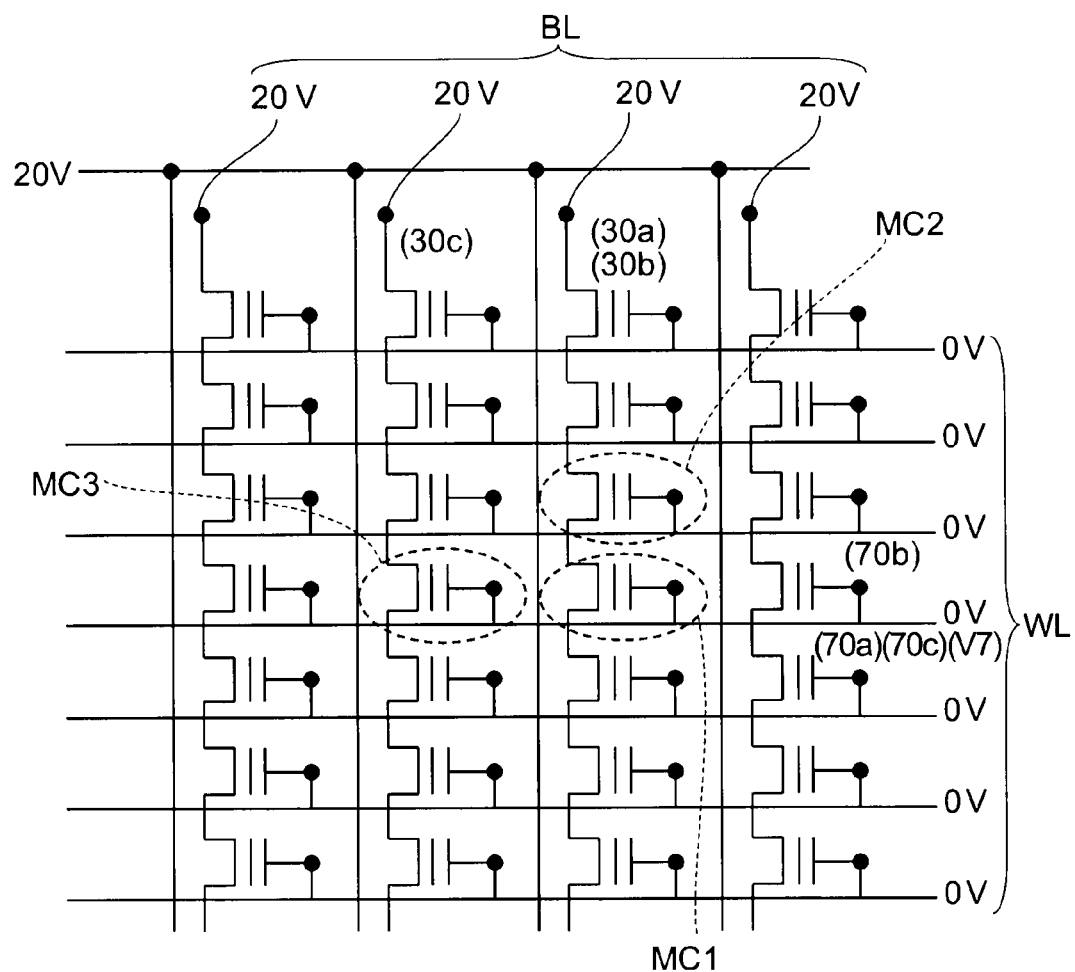
FIG. 8 is a schematic view illustrating another erase operation of the nonvolatile semiconductor memory device according to the first embodiment.

FIG. 8 is a schematic view illustrating another example of the erase operation of the nonvolatile semiconductor memory device according to the first embodiment.

FIG. 8 illustrates another operation when erasing the first memory portion MC1, the second memory portion MC2 and the third memory portion MC3.

The control unit 90 sets the potential of the first channel semiconductor layer 30a in an erase operation to the same potential as the base semiconductor layer 10a. In this example, the potential of the first base semiconductor layer 10a is set to 10 V and the first channel semiconductor layer 30a is set to 20 V. Furthermore, the control unit 90 sets the potential of the first electrode 70a to a seventh potential V7 that is lower than the potential of the first channel semiconductor layer 30a. In this example, the potential of the first electrode 70a is set to 0 V. In other words, the seventh potential V7 is set to minus 20 V.

The control unit 90 sets the potential of the second base semiconductor layer 10b and the third base semiconductor layer 10c to 20 V that is the same as the potential of the first base semiconductor layer 10a. Furthermore, the control unit 90 sets the potential of the second channel semiconductor layer 30b and the third channel semiconductor layer 30c to 20 V that is the same as the potential of the first channel semiconductor layer 30a. Furthermore, the control unit 90 sets the potential of the second electrode 70b and the third electrode 70c to 0 V that is the same as the potential of the first electrode 70a.

In this manner, erase operations using an FN tunnel current can be executed in the first to third memory portions, MC1 to MC3.

In the two examples of erase operations described above, the potential of the channel portion 31 (the first, second, third channel portions 31a, 31b, 31c, and the like), for example, is set to a predetermined value due to use of GIDL (gate-induced drain leakage) in relation to not less than one of the drain selection transistor STD and the source selection transistor STS. However, the embodiment is not limited in this regard, and the potential of the channel portion 31 may be provided by any arbitrary configuration. For example, an electrical contact may be provided in the channel portion 31, and the potential of the channel portion 31 may be set.

Figure 9:
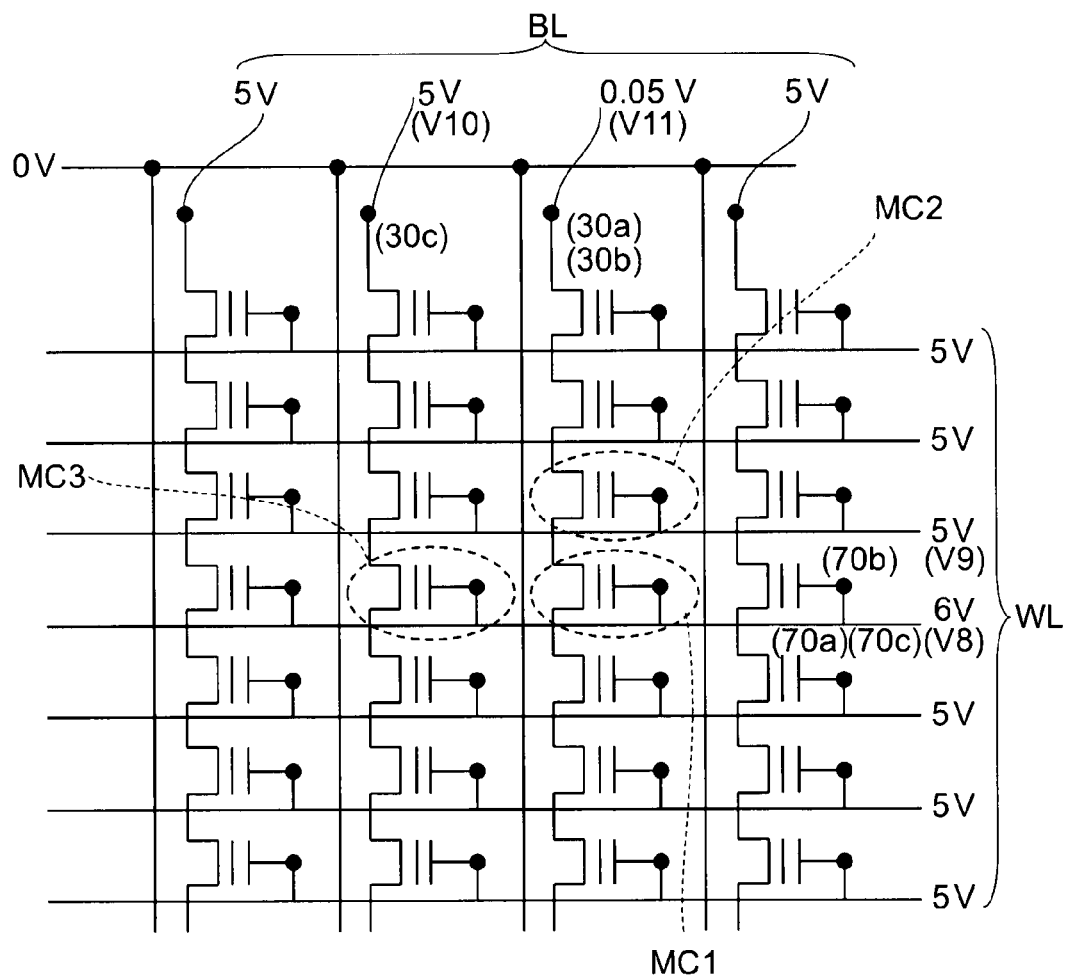
FIG. 9 is a schematic view illustrating a read operation of the nonvolatile semiconductor memory device according to the first embodiment.

FIG. 9 is a schematic view illustrating an example of the read operation of the nonvolatile semiconductor memory device according to the first embodiment.

FIG. 9 illustrates the operation when reading information stored in the first memory portion MC1, in other words, when detecting the threshold voltage of the first memory portion MC1.

In reading of the first memory portion MC1, the control unit 90 sets the potential of the first electrode 70a to an eighth potential V8 that is higher than the potential of the first base semiconductor layer 10a. In this example, the potential of the first base semiconductor layer 10a is set to 0 V, and the potential of the first electrode 70a is set to 6 V. In other words, the eighth potential V8 is set to 6 V. The control unit 90 sets the potential of the second electrode 70b to a ninth potential V9 that is lower than the eighth potential V8, and higher than the potential of the first base semiconductor layer 10a. In this example, the ninth potential V9 is 5 V. The potential of the third electrode 70c is set to the eighth potential V8 that is the same as the potential of the first electrode 70a (in other words, 6 V).

The control unit 90 sets the potential of the third channel semiconductor layer 30c to a tenth potential V10 that is lower than the eighth potential V8, and higher than the potential of the first base semiconductor layer 10a. In this example, the tenth potential V10 is set to 5 V that is the same as the ninth potential V9. The control unit 90 sets the potential of the first channel semiconductor layer 30a and the second channel semiconductor layer 30b to an eleventh potential V11 that is lower than the eighth to the tenth potentials, V8 to V10, and higher than the potential of the first base semiconductor layer 10a. The eleventh potential V11 is a detection voltage for read operations. The eleventh potential V11 is set to 0.05 V. In this manner, reading of the threshold characteristics of the first memory portion MC1 is enabled.

In this manner, in the nonvolatile semiconductor memory device 111 that includes multiple memory portions MC, a charge (electrons cg1) is efficiently stored in the charge retention layers 50 in respective memory portions MC, and thereby the program speed can be increased. In addition, erase and read operations can also be executed.

When multiple memory portions MC are provided as in the nonvolatile semiconductor memory device 111, selective programming can be executed in a part of the multiple memory portions MC by suitable control of the potential of the multiple base semiconductor layers 10.

In each of FIG. 6 to FIG. 9, the voltage values in the examples illustrated in the figures are relative values, and such values may be varied to absolute values to the degree allowed by the above operations.

Second Embodiment

Figure 10:
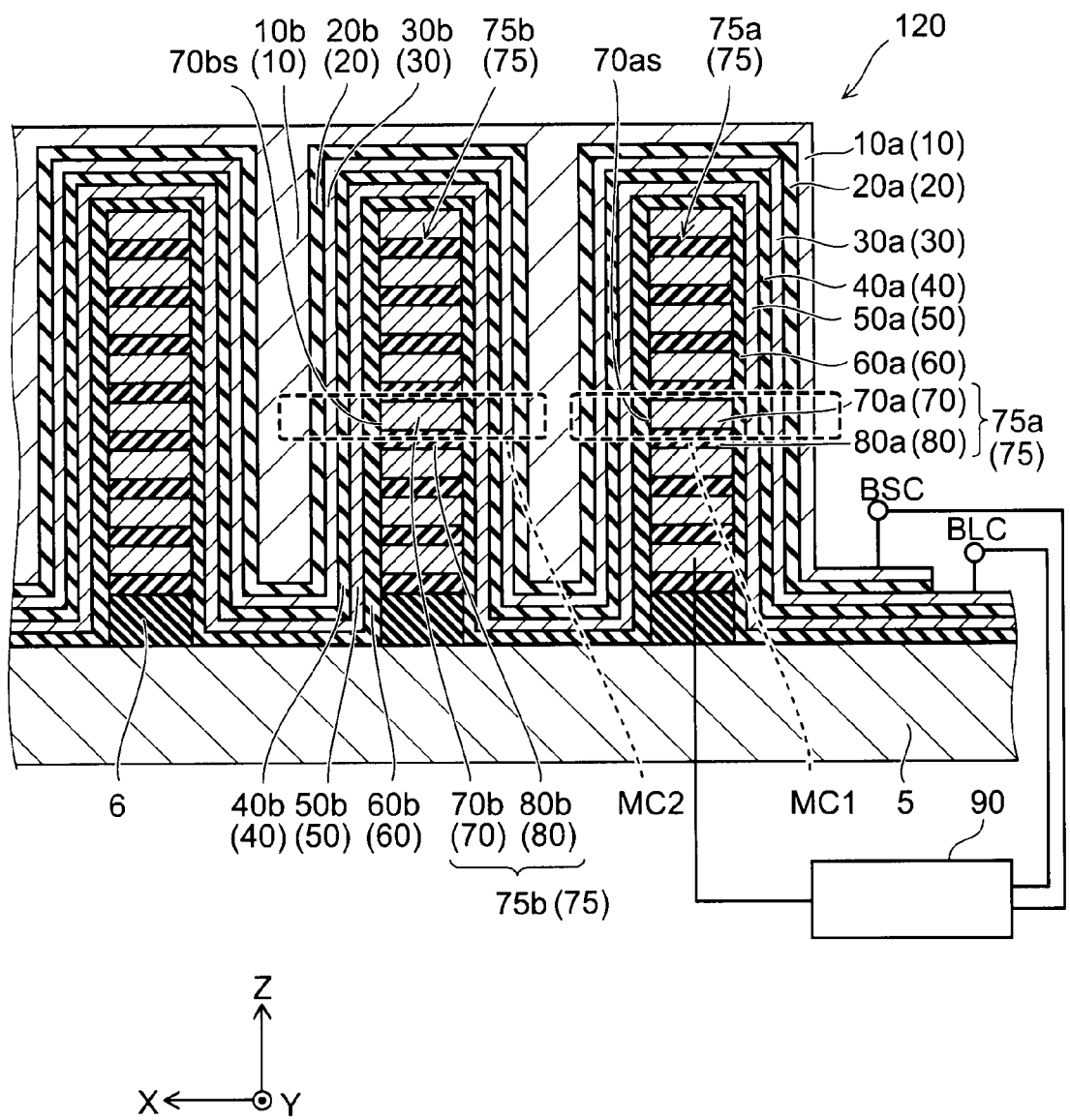
FIG. 10 is a schematic sectional view illustrating the configuration of a nonvolatile semiconductor memory device according to a second embodiment.

FIG. 10 is a schematic sectional view illustrating the configuration of a nonvolatile semiconductor memory device according to a second embodiment.

Figure 11:
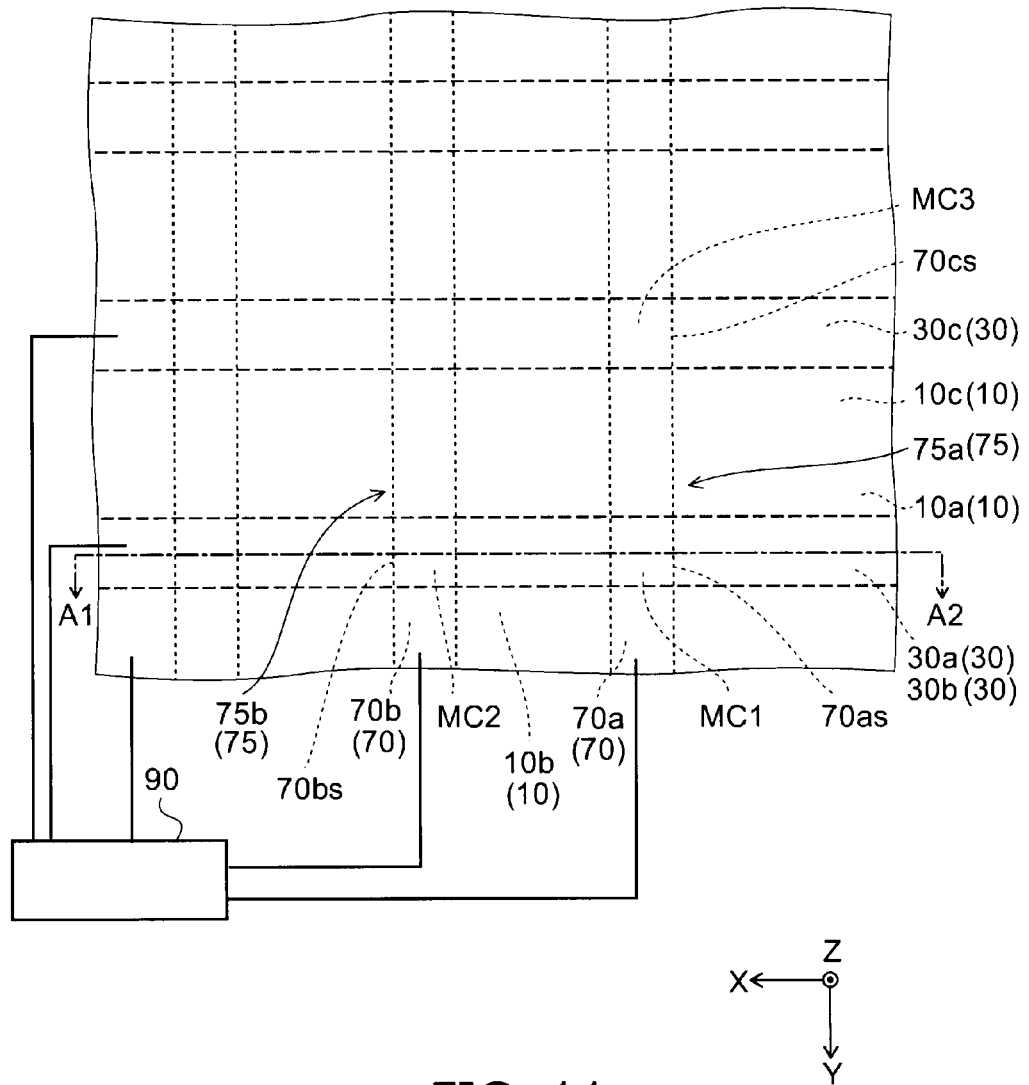
FIG. 11 is a schematic plan view illustrating the configuration of the nonvolatile semiconductor memory device according to the second embodiment.

FIG. 11 is a schematic plan view illustrating the configuration of the nonvolatile semiconductor memory device according to the second embodiment.

FIG. 10 is a sectional view along the line A1-A2 in FIG. 11. As illustrated in FIG. 10 and FIG. 11, the nonvolatile semiconductor memory device 120 includes a first stacked structure body 75a (stacked structure body 75). The first stacked structure body 75a includes multiple first electrodes 70a (gate electrodes 70) that are stacked in the first direction (Z-axis direction) and a first inter-electrode insulating layer 80a (inter-electrode insulating layer 80) provided between the multiple first electrodes 70a.

In FIG. 11, to facilitate comprehension of the figure, the gate electrode 70, the base semiconductor layer 10 and the channel semiconductor layer 30 are indicated.

The nonvolatile semiconductor memory device 120 may further include a substrate 5. The first stacked structure body 75a is provided on the major surface of the substrate 5. The first direction above is perpendicular to the major surface of the substrate 5.

The first electrode 70a extends along the Y-axis direction (third direction) that is perpendicular to the Z-axis direction. The direction that is orthogonal to the Z-axis direction and the Y-axis direction is denoted as the X-axis direction (second direction).

The nonvolatile semiconductor memory device 120 further includes the first base semiconductor layer 10a (base semiconductor layer 10), the first channel semiconductor layer 30*a* (channel semiconductor layer 30), the first base tunnel insulating film 20*a* (base tunnel insulating film 20), the first channel tunnel insulating film 40*a* (channel tunnel insulating film 40), the first charge retention layer 50*a* (charge retention layer 50), and the first block insulating film 60*a* (block insulating film 60).

The first base semiconductor layer 10*a* faces the first side surface 70*as* of the first electrode 70*a*. The first side surface 70*as* is a face along the Z-axis direction. The first channel semiconductor layer 30*a* is provided between the first side surface 70*as* and the first base semiconductor layer 10*a*. The first base tunnel insulating film 20*a* is provided between the first base semiconductor layer 10*a* and the first channel semiconductor layer 30*a*. The first channel tunnel insulating film 40*a* is provided between the first side surface 70*as* and the first channel semiconductor layer 30*a*. The first charge retention layer 50*a* is provided between the side surface 70*as* and the first channel tunnel insulating film 40*a*, and stores a charge. The first block insulating film 60*a* is provided between the first side surface 70*as* and the first charge retention layer 50*a*.

A base semiconductor layer contact BSC connected to the first base semiconductor layer 10*a* and a channel semiconductor layer contact BLC connected to the first channel semiconductor layer 30*a* are provided.

The configuration and material of the first base semiconductor layer 10*a*, the first channel semiconductor layer 30*a*, the first base tunnel insulating film 20*a*, the first channel tunnel insulating film 40*a*, the first charge retention layer 50*a*, and the first block insulating film 60*a* are the same as that described in relation to the first embodiment.

In the embodiment, the thickness t3 of the first channel semiconductor layer 30*a* is a length in the X-axis direction, and is set to be less than 30 nm. The thickness t3 is more preferably set to less than 10 nm. The thickness t2 of the base tunnel insulating film 20 is a length in the X-axis direction, and is set to be not less than 2 nm and 30 nm or less. The thickness t4 of the channel tunnel insulating film 40 is a length in the X-axis direction, and for example is set to be not less than 2 nm and 10 nm or less.

A memory portion MC (for example, first memory portion MC1) is formed in the respective multiple gate electrodes 70 (first electrodes 70*a*). The respective memory portions MC have the same operation as that described in relation to the first embodiment.

In other words, the nonvolatile semiconductor memory device 120 further includes the first base semiconductor layer 10*a*, the first channel semiconductor layer 30*a*, and the control unit 90 connected to multiple first electrodes 70*a*.

The control unit 90 executes the following processing when executing a program operation by injecting electrons cg1 into the first charge retention layer 50*a* (that is to say, the first charge retention layer 50*a* opposed to the first surface 70*as* of one of the first electrodes 70*a*).

The control unit 90 sets the potential of the first channel semiconductor layer 30*a* to a first potential V1 that is higher than the barrier potential difference φv that corresponds to the height of the electron energy barrier of the first channel tunnel insulating film 40*a* relative to the first channel semiconductor layer 30*a* when using the potential of the first base semiconductor layer 10*a* as a reference (reference potential).

The control unit 90 sets the potential of a first electrode 70*a* of one of the multiple first electrodes 70*a* to a second potential V2 that is higher than the first potential V1 when using the potential of the first base semiconductor layer 10*a* as a reference (reference potential)

Therefore the trapping efficiency for electrons cg1 in the charge retention layer 50 of the nonvolatile semiconductor memory device 120 is improved. In this manner, the speed of program operations can be increased. In addition, reliability can be improved.

Furthermore, the operations that were described above in relation to the first embodiment for erase operation and read operations can be applied.

The nonvolatile semiconductor memory device 120 further includes a second stacked structure body 75*b*. The second stacked structure body is aligned with the first stacked structure body 75*a* along the X-axis direction that is orthogonal to the Z-axis direction. The second stacked structure body 75*b* includes multiple second electrodes 70*b* stacked in the Z-axis direction and a second inter-electrode insulating layer 80*b* provided between the multiple second electrodes 70*b*.

The nonvolatile semiconductor memory device 120 further includes the second base semiconductor layer 10*b*, the second channel semiconductor layer 30*b*, the second base tunnel insulating film 20*b*, the second channel tunnel insulating film 40*b*, the second charge retention layer 50*b*, and the second block insulating film 60*b*.

The second base semiconductor layer 10*b* faces the second side surface 70*bs* of the second electrode 70*b*. The second side surface 70*bs* is a face along the Z-axis direction. The second channel semiconductor layer 30*b* is provided between the second side surface 70*bs* and the second base semiconductor layer 10*b*. The second base tunnel insulating film 20*b* is provided between the second base semiconductor layer 10*b* and the second channel semiconductor layer 30*b*. The second channel tunnel insulating film 40*b* is provided between the second side surface 70*bs* and the second channel semiconductor layer 30*b*. The second charge retention layer 50*b* is provided between the second side surface 70*bs* and the second channel tunnel insulating film 40*b*. The second block insulating film 60*b* is provided between the second side surface 70*bs* and the second charge retention layer 50*b*.

The multiple first electrodes 70*a* and multiple second electrodes 70*b* extend in the Y-axis direction that is orthogonal to the Z-axis and X-axis directions.

The second base semiconductor layer 10*b* is electrically connected to the first base semiconductor layer 10*a*. More specifically, the second base semiconductor layer 10*b* is continuous with the first base semiconductor layer 10*a*. In other words, a portion opposed to the first electrode 70*a* of the outer semiconductor layer that covers the first stacked structure body 75*a* and the second stacked structure body 75*b* configures the first base semiconductor layer 10*a*, and the portion opposed to the second electrode 70*b* configures the second semiconductor layer 10*b*.

The second channel semiconductor layer 30*b* is electrically connected to the first channel semiconductor layer 30*a*. More specifically, the second channel semiconductor layer 30*b* is continuous with the first channel semiconductor layer 30*a*. In other words, a portion opposed to the first electrode 70*a* of the inner semiconductor layer that covers the first stacked structure body 75*a* and the second stacked structure body 75*b* configures the first channel semiconductor layer 30*a*, and the portion opposed to the second electrode 70*b* configures the second channel semiconductor layer 30*b*.

As described above, the first electrode 70*a* and the second electrode 70*b* respectively extend along the Y-axis direction. In other words, the first electrode 70*a* and the second electrode 70*b* are segmented along the X-axis direction. In addition, the first channel semiconductor layer 30*a* and the second channel semiconductor layer 30*b* are continuous along the X-axis direction. In other words, the first channel semiconductor layer 30a and the second channel semiconductor layer 30b extend along the X-axis direction. The memory portion MC is formed in an intersection between the first electrode 70a and the first channel semiconductor layer 30a. A memory portion MC is formed in an intersection between the second electrode 70b and the second channel semiconductor layer 30b.

The nonvolatile semiconductor memory device 120 further includes the third base semiconductor layer 10c, the third channel semiconductor layer 30c, the third base tunnel insulating film 20c, the third channel tunnel insulating film 40c, the third charge retention layer 50c, and the third block insulating film 60c. The configuration of the third base semiconductor layer 10c, the third channel semiconductor layer 30c, the third base tunnel insulating film 20c, the third channel tunnel insulating film 40c, the third charge retention layer 50c, and the third block insulating film 60c is respectively the same as the first base semiconductor layer 10a, the first channel semiconductor layer 30a, the first base tunnel insulating film 20a, the first channel tunnel insulating film 40a, the first charge retention layer 50a, and the first block insulating film 60a, and therefore is not included in the figures.

The third base semiconductor layer 10c is continuous with the first base semiconductor layer 10a. In other words, the second base semiconductor layer 10b and the third base semiconductor layer 10c are electrically connected with the first base semiconductor layer 10a. The third base semiconductor layer 10c faces the third side surface 70cs of the first electrode 70a. The third side surface 70cs is a face along the Z-axis direction. The third side surface 70cs is continuous with the first side surface 70as. In other words, the respective third side surfaces 70cs are continuous with the respective first side surfaces 70as along the Y-axis direction. The third side surface 70cs is a surface along the Z-axis direction and the Y-axis direction.

The third channel semiconductor layer 30c is provided between the third side surfaces 70cs and the third base semiconductor layer 10c. The third channel semiconductor layer 30c extends along the direction of extension of the first channel semiconductor layer 30a, and is separated from the first channel semiconductor layer 30a. In other words, the third channel semiconductor layer 30c is a portion extending along the X-axis direction. Furthermore the third channel semiconductor layer 30c is a portion extending along the Z-axis direction.

The third base tunnel insulating film 20c is provided between the third base semiconductor layer 10c and the third channel semiconductor layer 30c. In the specific example, the third base tunnel insulating film 20c is continuous with the first base tunnel insulating film 20a and the second base tunnel insulating film 20b. The embodiment is not limited in this respect, and the third base tunnel insulating film 20c may not be continuous with the first base tunnel insulating film 20a and the second base tunnel insulating film 20b.

The third channel tunnel insulating film 40c is provided between the third side surface 70cs and the third channel semiconductor layer 30c. In the specific example, the third channel tunnel insulating film 40c is continuous with the first channel tunnel insulating film 40a. The embodiment is not limited in this respect, and the third channel tunnel insulating film 40c may not be continuous with the first channel tunnel insulating film 40a.

The third charge retention layer 50c is provided between the third side surface 70cs and the third channel tunnel insulating film 40c, and retains a charge. In the specific example, the third charge retention layer 50c is continuous with the first charge retention layer 50a. The embodiment is not limited in this respect, and the third charge retention layer 50c may not be continuous with the first charge retention layer 50a.

The third block insulating film 60c is provided between the third side surface 70cs and the third charge retention layer 50c. In the specific example, the third block insulating film 60c is continuous with the first block insulating film 60a. The embodiment is not limited in this respect, and the third block insulating film 60c may not be continuous with the first block insulating film 60a.

The third memory portion MC3 is formed in an intersection between the first electrode 70a and the third channel semiconductor layer 30c.

Therefore, the trapping efficiency for electrons cg1 in the charge retention layer 50 of the respective memory portions MC (the first memory portion MC1, the second memory portion MC2, the third memory portion MC3, and the like) is improved. In this manner, the speed of program operations can be increased. In addition, reliability can be improved.

In other words, the control unit 90 is further connected to the multiple second electrodes 70b and third channel semiconductor layer 30c. Since the second channel semiconductor layer 30b is electrically connected to the first channel semiconductor layer 30a, the second channel semiconductor layer 30b is connected to the control unit 90. Since the second base semiconductor layer 10b and the third base semiconductor layer 10c are connected to the first base semiconductor layer 10a, the control unit 90 is connected with the second base semiconductor layer 10b and the third base semiconductor layer 10c.

As described above, in a program operation in which electrons cg1 are injected into the first charge retention layer 50a, the control unit 90 sets the potential of the first channel semiconductor layer 30a to a first potential V1 that is higher than the barrier potential difference $\phi v$, when using the potential of the first base semiconductor layer 10a as a reference, and sets the respective potentials of the multiple electrodes 70a to a second potential V2 that is higher than the first potential V1 with reference to the reference potential.

The control unit 90 executes the following processing when executing a program operation of the first memory portion MC (that is to say, injecting electrons cg1 into the first electrode 70a).

The control unit 90 sets the potential of the multiple second electrodes 70b to a third potential V3 that is lower than the second potential V2 with reference to the potential of the second base semiconductor layer 10b.

The control unit 90 sets the potential of the third channel semiconductor layer 30c to a fourth potential V4 that is lower than the barrier potential difference $\phi v$ corresponding to the height of the energy barrier of electrons of the third channel tunnel insulating film 40c in relation to the third channel semiconductor layer 30c when using the potential of the third base semiconductor layer 10c as a reference.

For example, the potential of the second base semiconductor layer 10b and the third base semiconductor layer 10c is set to the reference potential (the potential of the first base semiconductor layer 10a). However, the potential of the first base semiconductor layer 10a, the potential of the second base semiconductor layer 10b, and the potential of the third base semiconductor layer 10c may mutually differ as a result of a fall in the voltage or the like.

For example, the potential of the second channel semiconductor layer 30b is set to the same potential as the potential of the first channel semiconductor layer 30a. However, the potential of the second channel semiconductor layer 30b may differ from the potential of the first channel semiconductor layer 30a as a result of a fall in the voltage or the like.

The first potential V1 is, for example, 5 V. The second potential V2 is, for example, 10 V. The third potential V3 is, for example, 6 V. The fourth potential V4 is, for example, 0 V. The program operation can be selectively executed in relation to the first memory portion MC1 by applying the above potentials to each memory portion MC.

Furthermore, the operations that were described above in relation to the first embodiment can be applied for erase operations and read operations.

The base tunnel insulating film 20, the channel tunnel insulating film 40, the charge retention layer 50 and the block insulating film 60 in the nonvolatile semiconductor memory device 120 have an arbitrary configuration.

For example, the second base tunnel insulating film 20b may be continuous with the first base tunnel insulating film 20a. The second base tunnel insulating film 20b may be separated from the first base tunnel insulating film 20a. The second channel tunnel insulating film 40b may be continuous with the first channel tunnel insulating film 40a, or the second channel tunnel insulating film 40b may be separated from the first channel tunnel insulating film 40a. The second charge retention layer 50b may be continuous with the first charge retention layer 50a, or the second charge retention layer 50b may be separated from the first charge retention layer 50a. The second block insulating film 60b may be continuous with the first block insulating film 60a, or the second block insulating film 60b may be separated from the first block insulating film 60a.

In the specific examples, eight layers of first electrodes 70a are provided in the first stacked structure body 75a, and eight layers of second electrodes 70b are provided in the second stacked structure body 75b. However, the number of stacked first electrodes 70a and the number of stacked second electrodes 70b is arbitrary.

An interlayer insulating film 6 is provided between the substrate 5 and the first stacked structure body 75a and between the substrate 5 and the second stacked structure body 75b. Silicon oxide, for example, is used in the interlayer insulating film 6. The interlayer insulating film 6 is provided as required, and may be omitted.

The first block insulating film 60a may be separated from the second block insulating film 60b, the first charge retention layer 50a may be separated from the second charge retention layer 50b, and the first channel tunnel insulating film 40a may be separated from the second channel tunnel insulating film 40b. An insulating layer is provided between the first channel semiconductor layer 30a and the second channel semiconductor layer 30b to prevent direct contact of these layers with the substrate 5. For example, the interlayer insulating film 6 provided on top of the substrate 5 is provided not between the stacked structure body 75 and the substrate 5, but also between the channel semiconductor layer 30 and the substrate 5.

Hereafter, an example of a method of manufacturing the nonvolatile semiconductor memory device 120 will be described.

FIG. 12A, FIG. 12B, FIG. 13A and FIG. 13B are sequential schematic sectional views illustrating a method for manufacturing the nonvolatile semiconductor memory device according to the second embodiment.

Figure 12A:
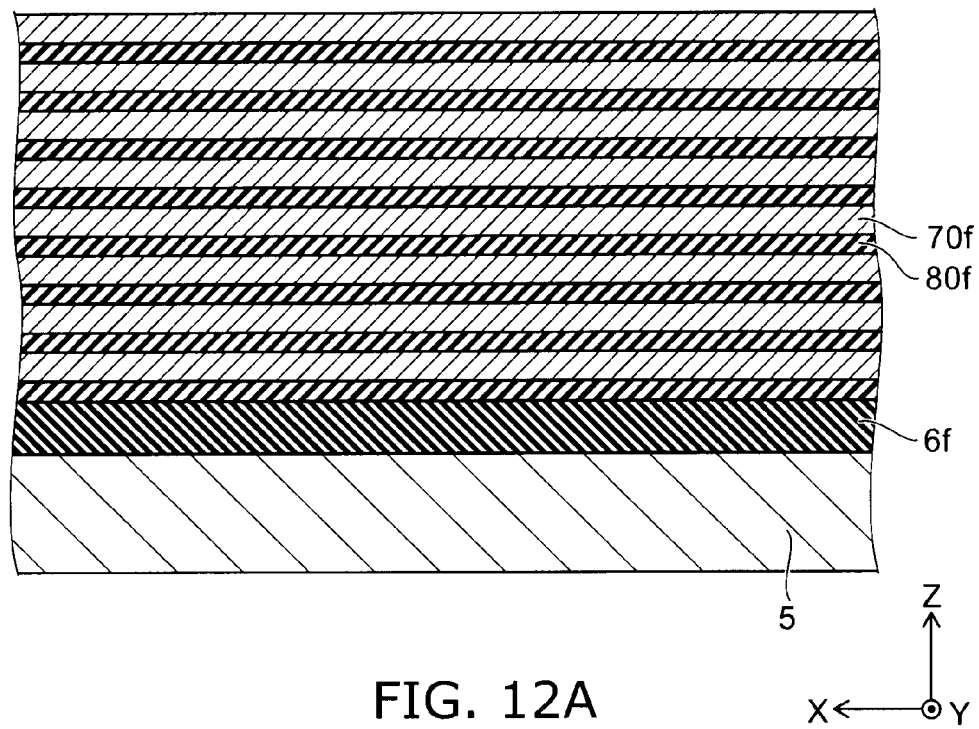
FIG. 12A and FIG. 12B are sequential schematic sectional views illustrating a method for manufacturing the nonvolatile semiconductor memory device according to the second embodiment.

As illustrated in FIG. 12A, an insulating film 6f that forms the interlayer insulating film 6 is formed on the substrate 5. An electrode conductive layer 70f that forms the gate electrode 70 and the insulating film 80f that forms the inter-electrode insulating layer 80 are alternately stacked on the insulating film 6f.

Figure 12B:
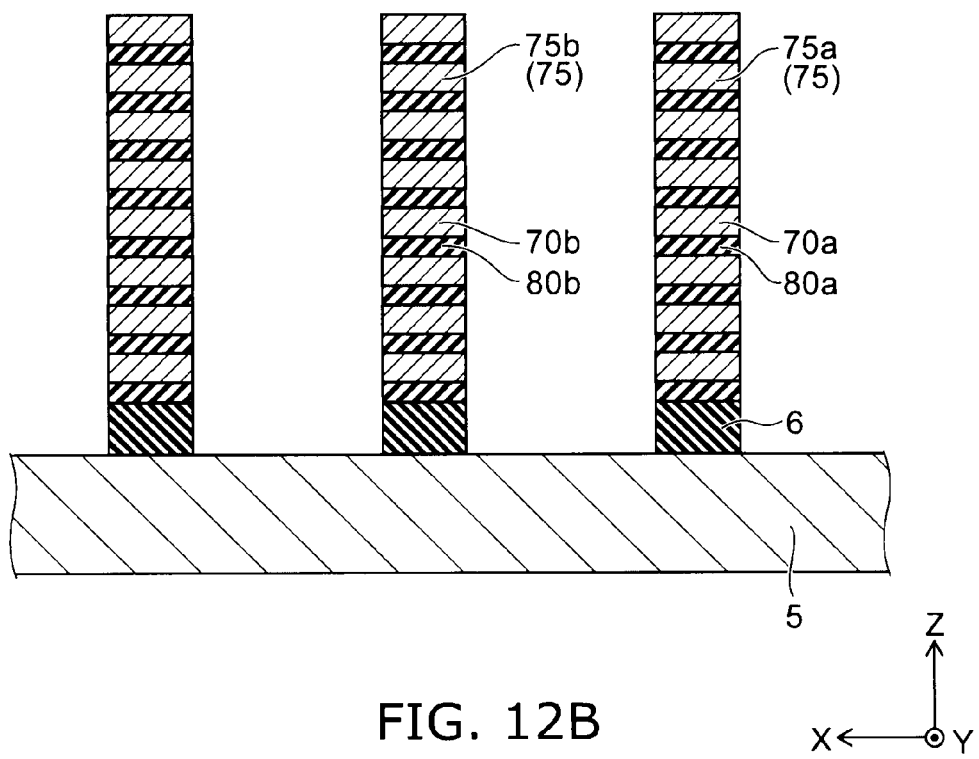

As illustrated in FIG. 12B, the electrode conductive layer 70f, the insulating film 80f and the insulating film 6f are formed in a band shape along the Y-axis direction. In this manner, the first electrode 70a, the second electrode 70b, the first inter-electrode insulating layer 80a, and the second inter-electrode insulating layer 80b are formed. That is to say, the stacked structure body 75 (first stacked structure body 75a and second stacked structure body 75b) is formed. The insulating film 6f is processed to thereby form the interlayer insulating film 6.

Figure 13A:
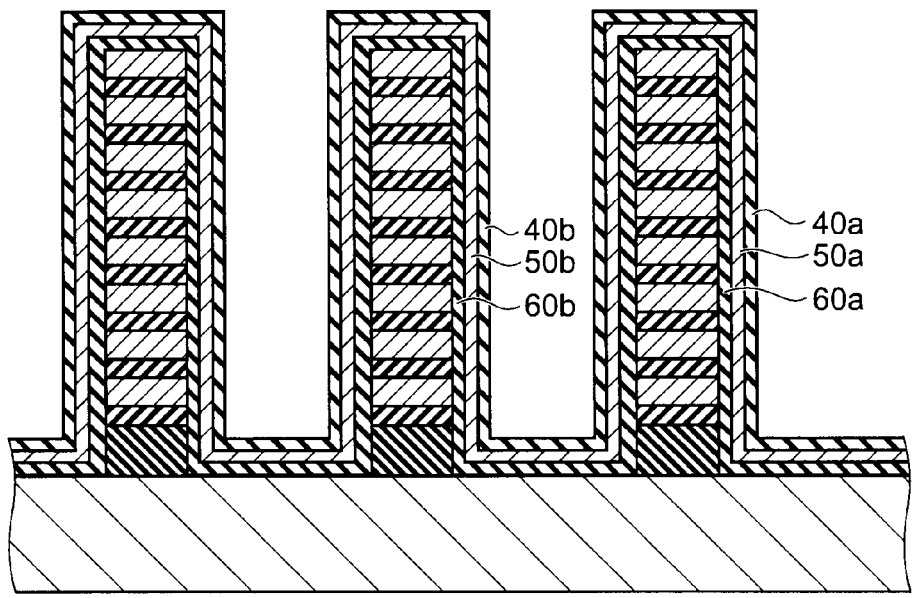
FIG. 13A and FIG. 13B are sequential schematic sectional views illustrating the method for manufacturing the nonvolatile semiconductor memory device according to the second embodiment.

As illustrated in FIG. 13A, the insulating film forming the block insulating film 60, the charge retention film forming the charge retention film 50, and the insulating film forming the channel tunnel insulating film 40 are formed in order to cover the stacked structure body 75.

In the specific examples, the first block insulating film 60a is continuous with the second block insulating film 60b, the first charge retention film 50a is continuous with the second charge retention film 50b, and the first channel tunnel insulating film 40a is continuous with the second channel tunnel insulating film 40b. However, these components may not be continuous. In this case, after forming the insulating film forming the block insulating film 60, the charge retention film forming the charge retention film 50, and the insulating film forming the channel tunnel insulating film 40, these films are processed in a band shape along the Y-axis direction.

Figure 13B:
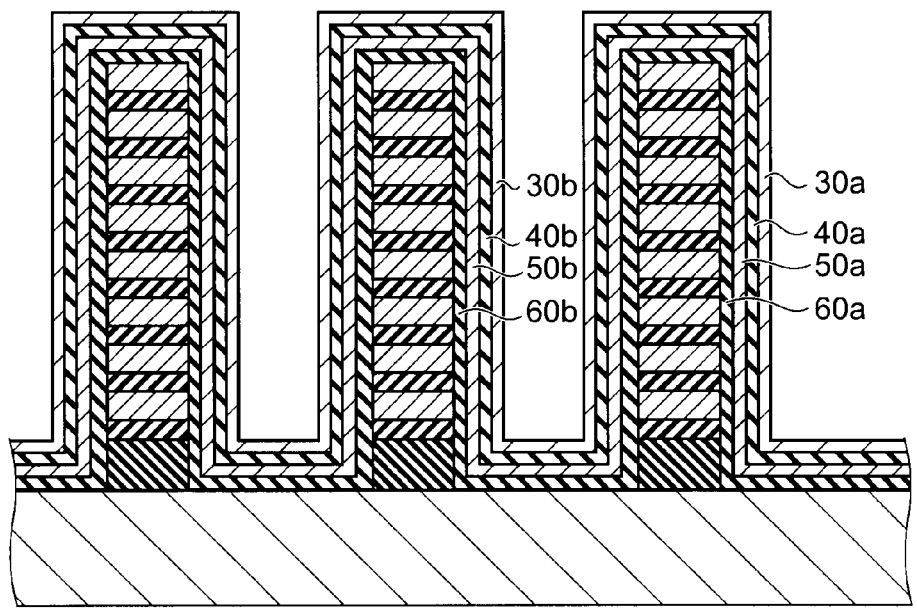

As illustrated in FIG. 13B, the semiconductor layer that forms the channel semiconductor layer 30 is formed to cover the channel tunnel insulating film 40 (the first channel tunnel insulating film 40a and the second channel tunnel insulating film 40b), and these semiconductor layers are processed in a band shape along the X-axis direction to thereby form the channel semiconductor layer 30 (the first channel semiconductor layer 30a and the second channel semiconductor layer 30b).

Thereafter, the base tunnel insulating film 20 is formed to cover the channel semiconductor layer 30, and the base semiconductor layer 10 is formed on the base tunnel insulating film 20. Thereafter, the base semiconductor layer contact BSC and the channel semiconductor layer contact BLC are formed.

In this manner, the nonvolatile semiconductor memory device 120 is formed.

In the method of manufacture, since multiple gate electrodes 70 are integrally formed on the substrate 5, a mass-produced nonvolatile semiconductor memory device can be manufactured with high productivity.

Third Embodiment

Figure 14:
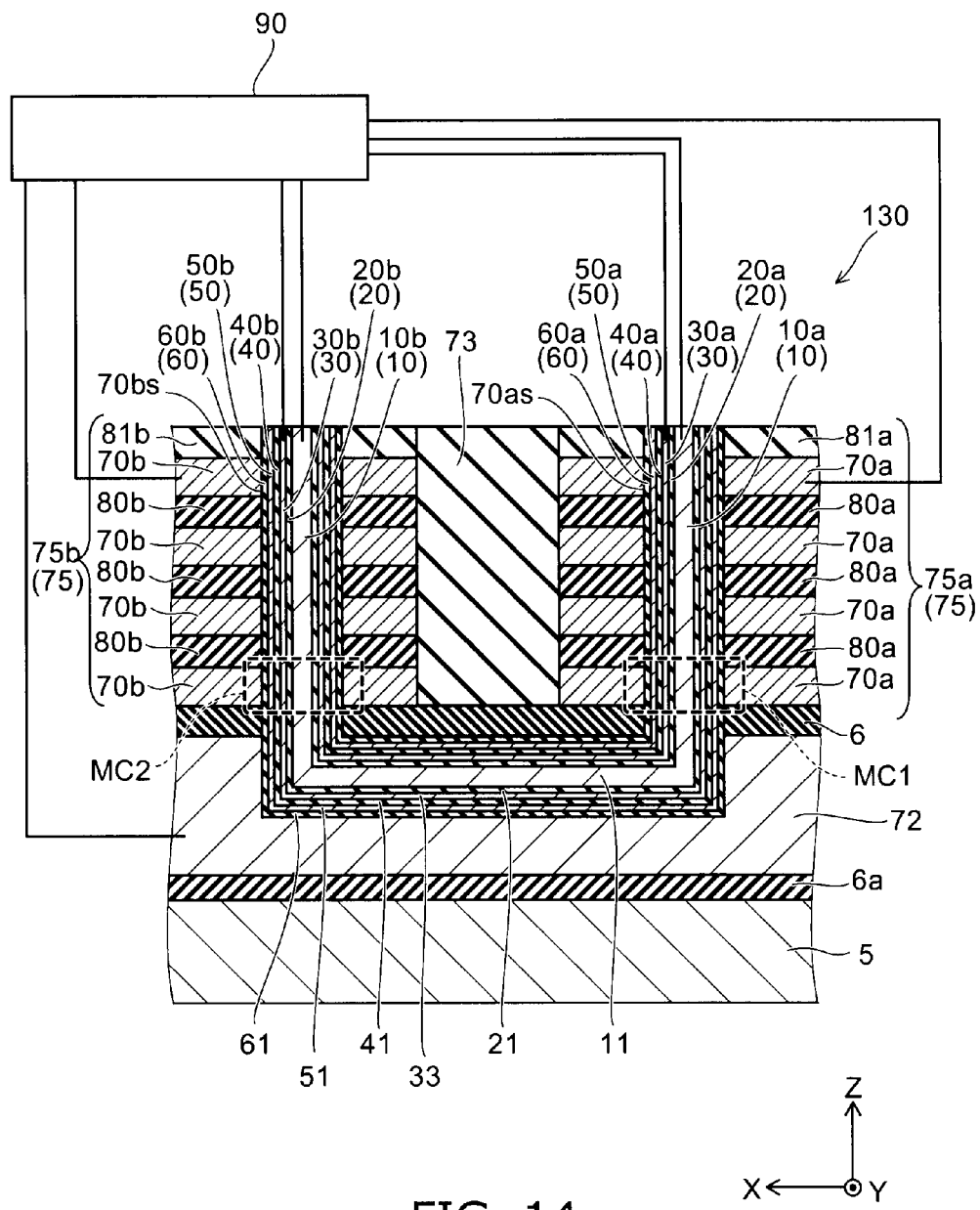
FIG. 14 is a schematic sectional view illustrating the configuration of a nonvolatile semiconductor memory device according to a third embodiment.

FIG. 14 is a schematic sectional view illustrating the configuration of a nonvolatile semiconductor memory device according to a third embodiment.

As illustrated in FIG. 14, the nonvolatile semiconductor memory device 130 includes a first stacked structure body 75a (stacked structure body 75). The first stacked structure body 75a includes multiple first electrodes 70a (gate electrodes 70) that are stacked in the first direction (Z-axis direction) and the first inter-electrode insulating layer 80a (inter-electrode insulating layer 80) provided between the multiple first electrodes 70a.

The nonvolatile semiconductor memory device 130 may further include the substrate 5. The first stacked structure body 75a is provided on the major surface of the substrate 5. The first direction above is perpendicular to the major surface of the substrate 5.

In the specific example, an insulating layer 81a is provided, and the first electrode 70a and the first inter-electrode insulating layer 80a are disposed between the substrate 5 and the insulating layer 81a.

The first electrode 70a extends along the Y-axis direction (third direction) that is perpendicular to the Z-axis direction. The direction that is orthogonal to the Z-axis direction and the Y-axis direction is denoted as the X-axis direction (second direction).

The nonvolatile semiconductor memory device 130 further includes the first base semiconductor layer 10a (base semiconductor layer 10), the first channel semiconductor layer 30a (channel semiconductor layer 30), the first base tunnel insulating film 20a (base tunnel insulating film 20), the first channel tunnel insulating film 40a (channel tunnel insulating film 40), the first charge retention layer 50a (charge retention layer 50), and the first block insulating film 60a (block insulating film 60).

The first base semiconductor layer 10a faces the first side surface 70as along the Z-axis direction of the first electrode 70a. The first channel semiconductor layer 30a is provided between the first side surface 70as and the first base semiconductor layer 10a. The first base tunnel insulating film 20a is provided between the first base semiconductor layer 10a and the first channel semiconductor layer 30a. The first channel tunnel insulating film 40a is provided between the first side surface 70as and the first channel semiconductor layer 30a. The first charge retention layer 50a is provided between the side surface 70as and the first channel tunnel insulating film 40a, and stores a charge. The first block insulating film 60a is provided between the first side surface 70as and the first charge retention layer 50a.

The first base semiconductor layer 10a in the nonvolatile semiconductor memory device 130 pierces the first stacked structure body 75a along the Z-axis direction. The first base tunnel insulating film 20a encloses the side surface of the first base semiconductor layer 10a along the Z-axis direction. The first channel semiconductor layer 30a encloses the side surface of the first base tunnel insulating film 20a along the Z-axis direction. The first channel tunnel insulating film 40a encloses the side surface of the first channel semiconductor layer 30a along the Z-axis direction. The first charge retention layer 50a encloses the side surface of the first channel tunnel insulating film 40a along the Z-axis direction. The first block insulating film 60a encloses the side surface of the first charge retention layer 50a along the Z-axis direction.

The first base tunnel insulating film 20a, the first channel semiconductor layer 30a, the first channel tunnel insulating film 40a, the first charge retention layer 50a, and the first block insulating film 60a pierce the first stacked structure body 70a along the Z-axis direction. Of the first electrodes 70a, the first side surface 70as of the first electrode 70a is the face that is opposed to the first base semiconductor layer 10a, the first base tunnel insulating film 20a, the first channel semiconductor layer 30a, the first channel tunnel insulating film 40a, the first charge retention layer 50a, and the first block insulating film 60a.

The first block insulating film 60a is tube shaped. The first charge retention layer 50a is provided on an inner side of the first block insulating film 60a. The first charge retention layer 50a is tube shaped. The first channel tunnel insulating film 40a is provided on an inner side of the first charge retention layer 50a. The first channel tunnel insulating film 40a is tube shaped. The first channel semiconductor layer 30a is provided on an inner side of the first channel tunnel insulating film 40a. The first channel semiconductor layer 30a is tube shaped. The first base tunnel insulating film 20a is provided on an inner side of the first channel semiconductor layer 30a. The first base tunnel insulating film 20a is tube shaped. The first base semiconductor layer 10a is provided on an inner side of the first base tunnel insulating film 20a.

The memory portion MC (for example, a first memory portion MC1) is formed in the respective multiple gate electrodes 70 (first electrode 70a). The operation of these respective memory portions MC is the same as that described in relation to the first embodiment.

In other words, the nonvolatile semiconductor memory device 130 further includes the first base semiconductor layer 10a, the first channel semiconductor layer 30a, and the control unit 90 connected to multiple first electrodes 70a.

When executing a program operation by injecting electrons cg1 into the first charge retention layer 50a (that is to say, the first charge retention layer 50a opposed to the first surface 70as of one of the multiple first electrodes 70a), the control unit 90 sets the potential of the first channel semiconductor layer 30a to a first potential V1 that is higher than the barrier potential difference $\phi v$ that corresponds to the height of the electron energy barrier of the first channel tunnel insulating film 40a relative to the first channel semiconductor layer 30a when using the potential of the first base semiconductor layer 10a as a reference (reference potential).

The control unit 90 sets the potential of the first electrode 70a of one of the multiple first electrodes 70a to a second potential V2 that is higher than the first potential V1 when using the reference potential.

Therefore, the trapping efficiency for electrons cg1 in the charge retention layer 50 of the nonvolatile semiconductor memory device 130 is improved. In this manner, the speed of program operations can be increased. In addition, reliability can be improved.

The nonvolatile semiconductor memory device 130 further includes a second stacked structure body 75b. The second stacked structure body 75b is aligned with the first stacked structure body 75a along the X-axis direction. The second stacked structure body 75b includes multiple second electrodes 70b stacked along the Z-axis direction and a second inter-electrode insulating layer 80b provided between the multiple second electrodes 70b.

In the specific example, an insulating layer 81b is provided, and the second electrode 70b and the second inter-electrode insulating layer 80b are disposed between the substrate 5 and the insulating layer 81b. The insulating layer 81b is taken to be included in the second stacked structure body 75b.

The respective major surfaces of the multiple second electrodes 70b are within the plane including the respective major surfaces of the multiple first electrodes 70a. In other words, the respective multiple second electrodes 70b are in the same layer as the respective multiple first electrodes 70a. The distance between the respective multiple second electrodes 70b and the substrate 5 is equal to the distance between the respective multiple first electrodes 70a and the substrate 5.

The nonvolatile semiconductor memory device 130 further includes the second base semiconductor layer 10b, the second base tunnel insulating film 20b, the second channel semiconductor layer 30b, the second channel tunnel insulating film 40b, the second charge retention layer 50b, the second block insulating film 60b, and the connection channel semiconductor layer 33.

The second base semiconductor layer 10b faces the first side surface 70as along the Z-axis direction of the second electrode 70b, and pierces the second stacked structure body 75b along the Z-axis direction. The second base tunnel insulating film 20b is provided between the second side surface 70bs and the second base semiconductor layer 10b. The second base tunnel insulating film 20b encloses the side surface of the second base semiconductor layer 10b along the Z-axis direction. The second channel semiconductor layer 30b is provided between the second side surface 70bs and the second base tunnel insulating film 20b. The second channel tunnel insulating film 40b is provided between the second side surface 70bs and the second channel semiconductor layer 30b. The second channel tunnel insulating film 40b encloses the side surface of the second channel semiconductor layer 30b along the Z-axis direction. The second charge retention layer 50b is provided between the second side surface 70bs and the second channel tunnel insulating film 40b. The second charge retention layer 50b encloses the side surface of the second channel tunnel insulating film 40b along the Z-axis direction, and retains a charge. The second block insulating film 60b is provided between the second side surface 70bs and the second charge retention layer 50b. The second block insulating film 60b encloses the side surface of the second charge retention layer 50b along the Z-axis direction.

The second base tunnel insulating film 20b, the second channel semiconductor layer 30b, the second channel tunnel insulating film 40b, the second charge retention layer 50b and the second block insulating film 60b pierce the first stacked structure body 70a along the Z-axis direction. Of the second electrodes 70b, the second side surface 70bs of the second electrode 70b is the face that is opposed to the second base semiconductor layer 10b, the second base tunnel insulating film 20b, the second channel semiconductor layer 30b, the second channel tunnel insulating film 40b, the second charge retention layer 50b and the second block insulating film 60b.

The second block insulating film 60b is tube shaped. The second charge retention layer 50b is provided on an inner side of the second block insulating film 60b. The second charge retention layer 50b is tube shaped. The second channel tunnel insulating film 40b is provided on an inner side of the second charge retention layer 50b. The second channel tunnel insulating film 40b is tube shaped. The second channel semiconductor layer 30b is provided on an inner side of the second channel tunnel insulating film 40b. The second channel semiconductor layer 30b is tube shaped. The second base tunnel insulating film 20b is provided on an inner side of the second channel semiconductor layer 30b. The second base tunnel insulating film 20b is tube shaped. The first base semiconductor layer 10a is provided on an inner side of the second base tunnel insulating film 20b.

The connection channel semiconductor layer 33 is electrically connected to the first channel semiconductor layer 30a and the second channel semiconductor layer 30b.

The same configuration (including material) as the first base semiconductor layer 10a is applied in the second base semiconductor layer 10b. The same configuration (including material) as the first base tunnel insulating film 20a is applied in the second base tunnel insulating film 20b. The same configuration (including material) as the first channel insulating film 30a is applied in the second channel insulating film 30b. The same configuration (including material) as the first channel tunnel insulating film 40a is applied in the second channel tunnel insulating film 40b. The same configuration (including material) as the first charge retention layer 50a is applied in the second charge retention layer 50b. The same configuration (including material) as the first block insulating film 60a is applied in the second block insulating film 60b.

The material used in the first channel semiconductor layer 30a and the second channel semiconductor layer 30b is used in the connection channel semiconductor layer 33.

The nonvolatile semiconductor memory device 130 further includes a connection base semiconductor layer 11 and a connection base tunnel insulating film 21. However the connection base semiconductor layer 11 and the connection base tunnel insulating film 21 are provided as required, and may be omitted as appropriate. In the following description, the configuration will be described that is provided with the connection base semiconductor layer 11 and the connection base tunnel insulating film 21.

The connection base semiconductor layer 11 is electrically connected with the end of the first base semiconductor layer 10a (for example, the lower end, the end on the side of the substrate 5), and the end of the second base semiconductor layer 10b (for example, the lower end, the end on the side of the substrate 5). The connection base semiconductor layer 11 extends, for example, within the X-Y plane. In the specific example, the connection base semiconductor layer 11 extends along the X-axis direction.

The connection base tunnel insulating film 21 is provided between the connection channel semiconductor layer 33 and the connection base semiconductor layer 11.

The side surface of the connection base semiconductor layer 11 is a surface that is substantially perpendicular to the Z-axis direction. The connection base tunnel insulating film 21 extends along the X-axis direction, and encloses the side surface of the connection base semiconductor layer 11. The side surface of the connection base tunnel insulating film 21 is a surface that is substantially perpendicular to the Z-axis direction. The connection channel semiconductor layer 33 extends along the X-axis direction, and encloses the side surface of the connection base tunnel insulating film 21.

The nonvolatile semiconductor memory device 130 further includes a connection conductive layer 72, a connection channel tunnel insulating film 41, a connection charge retention layer 51, and a connection block insulating film 61.

The connection conductive layer 72 is provided to oppose the connection channel semiconductor layer 33. In the specific example, an interlayer insulating film 6a is provided between the substrate 5 and the stacked structure body 75 (for example, the first stacked structure body 75a and the second stacked structure body 75b). The connection conductive layer 72 is provided between the interlayer insulating film 6a and the stacked structure body 75. In the specific example, the interlayer insulating film 6 is provided between the connection conductive layer 72 and the stacked structure body 75 (for example, the first stacked structure body 75a and the second stacked structure body 75b).

The connection channel tunnel insulating film 41 is provided between the connection channel semiconductor layer 33 and the connection conductive layer 72. The connection charge retention layer 51 is provided between the connection channel tunnel insulating film 41 and the connection conductive layer 72. The connection block insulating film 61 is provided between the connection charge retention layer 51 and the connection conductive layer 72.

For example, the material used in the connection base semiconductor layer 11 is the same as the material used in the first and the second base semiconductor layers 10a and 10b. The material used in the connection base tunnel insulating film 21 is the same as the material used in the first and the second base tunnel insulating films 20a and 20b. The material used in the connection conductive layer 72 is the same as the material used in the first and the second electrodes 70a and 70b. The material used in the connection channel tunnel insulating film 41 is the same as the material used in the first and the second channel tunnel insulating films 40a and 40b. The material used in the connection charge retention layer 51 is the same as the material used in the first and the second charge retention layers 50*a* and 50*b*. The material used in the connection block insulating film 61 is the same as the material used in the first and the second block insulating films 60*a* and 60*b*.

The interlayer insulating film 73 that extends in the Y-axis direction is provided between the first stacked structure body 75*a* and the second stacked structure body 75*b*.

The control unit 90 in the nonvolatile semiconductor memory device 130 is connected to multiple second electrodes 70*b*.

In program operations by injection of electrons cg1 to the first charge retention layer 50*a* (that is to say, the first charge retention layer 50*a* opposed to the first side surface 70*as* of one of the multiple first electrodes 70*a*), the control unit 90 sets the potential of the multiple second electrodes 70*b* to a third potential V3 that is lower than the second potential V2 with reference to the potential of the second base semiconductor layer 10*b*.

The control unit 90 is further connected to the second base semiconductor layer 10*b*. For example, the potential of the second base semiconductor layer 10*b* is set to the same potential as the first base semiconductor layer 10*a*. However due to a fall in the voltage or the like, the potential of the second base semiconductor layer 10*b* may differ from the potential of the first base semiconductor layer 10*a*. The potential of the second channel semiconductor layer 30*b*, for example, is set to the first potential V1 (the potential of the first channel semiconductor layer 30*a*). However due to a fall in the voltage or the like, the potential of the second channel semiconductor layer 30*a* may differ from the potential of the first channel semiconductor layer 30*a*.

The first potential V1 is, for example, 5 V. The second potential V2 is, for example, 10 V. The third potential V3 is, for example, 6 V. Selective program operations can be executed in relation to the first memory portion MC1 by applying the above voltages to each memory portion MC.

The nonvolatile semiconductor memory device 130 further includes the third base semiconductor layer (one of the base semiconductor layers 10, not illustrated in the figures), the third channel insulating film (one of the channel semiconductor layers 30, not illustrated in the figures), the third base tunnel insulating film (one of the base tunnel insulating films 20, not illustrated in the figures), the third channel tunnel insulating film (one of the base channel tunnel insulating films 40, not illustrated in the figures), the third charge retention layer (one of the charge retention layers 50, not illustrated in the figures), and the third block insulating film (one of the block insulating films 60, not illustrated in the figures).

The third base semiconductor layer is aligned along the Y-axis direction with the first base semiconductor layer 10*a*. The third base semiconductor layer pierces the first stacked structure body 75*a* along the Z-axis direction. The third base tunnel insulating film faces the third side surface of the first electrode 70*a* along the Z-axis direction. The third base tunnel insulating film is provided between the third side surface and the third base semiconductor layer, and encloses the side surface of the third semiconductor layer along the Z-axis direction. The third channel semiconductor layer is provided between the third side surface and the third base tunnel insulating film, and encloses the side surface of the third base tunnel insulating film along the Z-axis direction. The third channel tunnel insulating film is provided between the third side surface and the third channel semiconductor layer, and encloses the side surface of the third channel semiconductor layer along the Z-axis direction. The third charge retention layer is provided between the third side surface and the third channel tunnel insulating film, encloses the side surface of the second channel tunnel insulating film along the Z-axis direction, and retains a charge. The third block insulating film is provided between the third side surface and the third charge retention layer, and encloses the side surface of the third charge retention layer along the Z-axis direction.

The third base tunnel insulating film, the third channel semiconductor layer, the third channel tunnel insulating film, the third charge retention layer and the third block insulating film pierce the first stacked structure body 75*a* along the Z-axis direction. Of the first electrodes 70*a*, the third side surface of the first electrode 70*a* is the face that is opposed to the third base semiconductor layer, the third base tunnel insulating film, the third channel semiconductor layer, the third channel tunnel insulating film, the second charge retention layer and the second block insulating film.

The third block insulating film is tube shaped. The third charge retention layer is provided on an inner side of the third block insulating film. The third charge retention layer is tube shaped. The third channel tunnel insulating film is provided on an inner side of the third charge retention layer. The third channel tunnel insulating film is tube shaped. The third channel semiconductor layer is provided on an inner side of the third channel tunnel insulating film. The third channel semiconductor layer is tube shaped. The third base tunnel insulating film is provided on an inner side of the third channel semiconductor layer. The third base tunnel insulating film is tube shaped. The first base semiconductor layer is provided on an inner side of the third base tunnel insulating film.

The memory portion MC (for example, third memory portion) is formed in respective intersecting portions between the multiple gate electrodes 70 (first electrode 70*a*) and the third channel semiconductor layer. The operation of the third memory portion is the same as that described in relation to the first embodiment.

The control unit 90 is further connected to the third channel semiconductor layer. In program operations by injection of electrons cg1 to the first charge retention layer 50*a* (that is to say, the first charge retention layer 50*a* opposed to the first side surface 70*as* of one of the multiple first electrodes 70*a*), the control unit 90 sets the potential of the third channel semiconductor layer to a fourth potential V4 that is lower than the barrier potential difference φv corresponding to the height of the energy barrier of electrons of the third channel tunnel insulating film in relation to the third channel semiconductor layer when using the potential of the third base semiconductor layer as a reference. For example, the fourth potential V4 is 0 V.

The control unit 90 may be further connected to the connection conductive layer 72. The control unit 90 controls the potential of the connection conductive layer 72, and can place the first channel semiconductor layer 30*a* and the second channel semiconductor layer 30*b* in electrical connection. Furthermore the control unit 90 controls the potential of the connection conductive layer 72, and can place the first base semiconductor layer 10*a* and the second base semiconductor layer 10*b* in electrical connection. In other words, in the nonvolatile semiconductor memory device 130, a U-shaped NAND string can be formed, for example, by the first channel semiconductor layer 30*a*, the second channel semiconductor layer 30*b*, and the connection channel semiconductor layer 33. Electrons (electrons cg1) are efficiently stored in the charge retention layer 50 in the respective memory portions MC arrayed in a U-shaped configuration, and thereby the program speed can be increased. The erase operations and read operations can be applied in the same manner as the first embodiment.

According to the embodiment, the nonvolatile semiconductor memory device enabling high-speed programming is provided.

In the specification according to the application, "perpendicular" and "parallel" do not merely denote a strict perpendicular and parallel direction, but also include for example the deviations arising from a manufacturing process, and may be substantially perpendicular or substantially parallel.

The aspects of the embodiments of the invention have been described with reference to the specific examples. However the invention is not limited to the specific examples. For example, the precise configuration of each constituent element including the base semiconductor layer, the electrode (gate electrode), the channel portion, the channel semiconductor portion, the base tunnel insulating film, the channel tunnel insulating film, the charge retention layer, the block insulating film, the inter-electrode insulating film, the stacked structure body, and the control unit, or the like that are included in the nonvolatile semiconductor memory device is included within the scope of the invention, and the invention may be executed as long as the same effect is obtained by suitable selection by a person ordinarily skilled in the technical field within the known scope. For example, the material or film thickness described with respect to the embodiments is merely exemplary, and various selections are possible.

Components in two or more of the specific examples can be combined with each other as long as technically feasible, and such combinations are also encompassed within the scope of the invention as long as they fall within the spirit of the invention.

The nonvolatile semiconductor memory device described above as the embodiment of the invention can be suitably modified and practiced by those skilled in the art, and such modifications are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
   a first memory portion, the first memory portion including:
      a first base semiconductor layer;
      a first electrode;
      a first channel semiconductor layer provided between the first base semiconductor layer and the first electrode, and including a first channel portion opposed to the first electrode, the first channel semiconductor layer having a first electron energy barrier height;
      a first base tunnel insulating film provided between the first base semiconductor layer and the first channel semiconductor layer;
      a first channel tunnel insulating film provided between the first electrode and the first channel portion, the first channel tunnel insulating film having a second electron energy barrier height;
      a first charge retention layer provided between the first electrode and the first channel tunnel insulating film to retain a charge; and
      a first block insulating film provided between the first electrode and the first charge retention layer, and
   a control circuit connected to both of the first base semiconductor layer and the first channel semiconductor layer,
   wherein the control circuit is configured to set a potential of the first channel semiconductor layer to a first potential to inject electrons into the first charge retention layer from the first base semiconductor layer through the first base tunnel insulating film, the first channel semiconductor layer and the first channel tunnel insulating film,
   the first potential is defined with reference to a potential of the first base semiconductor layer, and
   the first potential is higher than a barrier potential difference corresponding to a difference between the first electron energy barrier height and the second electron energy barrier height.

2. The device according to claim 1, further comprising:
   in a program operation injecting electrons into the first charge retention layer, the control unit being configured to set a potential of the first channel semiconductor layer to a first potential higher than a barrier potential difference corresponding to a height of an electron energy barrier of the first channel tunnel insulating film relative to the first channel semiconductor layer with reference to a potential of the first base semiconductor layer.

3. The device according to claim 2, wherein the control unit is further connected to the first electrode, and
   in the program operation, the control unit sets a potential of the first electrode to a second potential higher than the first potential with reference to the potential of the first base semiconductor layer.

4. The device according to claim 3, further comprising:
   a second memory portion aligned with the first memory portion along a second direction perpendicular to a first direction from the first base semiconductor layer toward the first electrode, the second memory portion including:
      a second base semiconductor layer;
      a second electrode;
      a second channel semiconductor layer provided between the second base semiconductor layer and the second electrode, and including a second channel portion opposed to the second electrode;
      a second base tunnel insulating film provided between the second base semiconductor layer and the second channel semiconductor layer;
      a second channel tunnel insulating film provided between the second electrode and the second channel portion;
      a second charge retention layer provided between the second electrode and the second channel tunnel insulating film to retain a charge; and
      a second block insulating film provided between the second electrode and the second charge retention layer; and
   a third memory portion aligned with the first memory portion along a third direction perpendicular to the first direction and the second direction,
   the third memory portion including:
      a third base semiconductor layer;
      a third electrode;

a third channel semiconductor layer provided between the third base semiconductor layer and the third electrode, and including a third channel portion opposed to the third electrode;

a third base tunnel insulating film provided between the third base semiconductor layer and the third channel semiconductor layer;

a third channel tunnel insulating film provided between the third electrode and the third channel portion;

a third charge retention layer provided between the third electrode and the third channel tunnel insulating film to retain a charge; and a third block insulating film provided between the third electrode and the third charge retention layer, the third base semiconductor layer being electrically connected to the first base semiconductor layer and the second base semiconductor layer, the second channel semiconductor layer being electrically connected to the first channel semiconductor layer, the third channel semiconductor layer being electrically isolated from the first channel semiconductor layer and the second channel semiconductor layer, the third electrode being electrically connected to the first electrode, the control unit being further connected to the second electrode and the third channel semiconductor layer, and in the program operation, the control unit being configured to set a potential of the second electrode to a third potential lower than the second potential with reference to a potential of the second base semiconductor layer and to set a potential of the third channel semiconductor layer to a fourth potential higher than a barrier potential difference corresponding to a height of an electron energy barrier of the third channel tunnel insulating film relative to the third channel semiconductor layer with reference to a potential of the third base semiconductor layer.

5. The device according to claim 1, wherein the injection of electrons includes ballistic injection of electrons.

6. The device according to claim 2, wherein in the program operation, an electric field applied between the first base semiconductor layer and the first channel semiconductor layer is 10 megavolts/centimeter or less.

7. The device according to claim 2, wherein in the program operation, an electric field applied between the first channel semiconductor layer and the first electrode is 10 megavolts/centimeter or less.

8. The device according to claim 1, wherein a thickness of the first channel semiconductor layer is less than 30 nanometers, a thickness of the first base tunnel insulating film is 2 nanometers or more and 10 nanometers or less, and a thickness of the first channel tunnel insulating film is 2 nanometers or more and 10 nanometers or less.

* * * * *